United States Patent
Avenier et al.

(10) Patent No.: US 11,984,360 B2
(45) Date of Patent: May 14, 2024

(54) METHOD FOR PRODUCING A DIODE

(71) Applicant: STMicroelectronics (Crolles 2) SAS, Crolles (FR)

(72) Inventors: Gregory Avenier, Saint Nazaire les Eymes (FR); Alexis Gauthier, Meylan (FR); Pascal Chevalier, Chapareillan (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 45 days.

(21) Appl. No.: 17/728,088

(22) Filed: Apr. 25, 2022

(65) Prior Publication Data
US 2022/0254686 A1    Aug. 11, 2022

Related U.S. Application Data

(62) Division of application No. 16/909,333, filed on Jun. 23, 2020, now Pat. No. 11,348,834.

(30) Foreign Application Priority Data

Jun. 28, 2019 (FR) .................................... 1907150

(51) Int. Cl.
| | |
|---|---|
| *H01L 21/82* | (2006.01) |
| *H01L 21/3105* | (2006.01) |
| *H01L 21/8222* | (2006.01) |
| *H01L 21/8249* | (2006.01) |
| *H01L 27/06* | (2006.01) |
| *H01L 29/66* | (2006.01) |

(Continued)

(52) U.S. Cl.
CPC .... *H01L 21/8222* (2013.01); *H01L 21/31056* (2013.01); *H01L 21/8249* (2013.01); *H01L 27/0664* (2013.01); *H01L 29/66174* (2013.01); *H01L 29/66242* (2013.01); *H01L 29/7371* (2013.01); *H01L 29/93* (2013.01)

(58) Field of Classification Search
CPC .......... H01L 21/8222; H01L 21/31056; H01L 21/8249; H01L 27/0664; H01L 29/66174; H01L 29/66242; H01L 29/7371; H01L 29/93; H01L 29/0804; H01L 29/1004; H01L 29/0684
See application file for complete search history.

(56) References Cited

U.S. PATENT DOCUMENTS

| | | | |
|---|---|---|---|
| 5,405,790 A | 4/1995 | Rahim et al. | |
| 7,682,919 B2 | 3/2010 | Johansson | |

(Continued)

FOREIGN PATENT DOCUMENTS

| | | |
|---|---|---|
| CN | 1369918 A | 9/2002 |
| CN | 107342223 A | 11/2017 |

(Continued)

OTHER PUBLICATIONS

INPI Search Report and Written Opinion for FR 1907150 dated Feb. 20, 2020 (10 pages).

(Continued)

*Primary Examiner* — Shouxiang Hu
(74) *Attorney, Agent, or Firm* — Crowe & Dunlevy LLC

(57) ABSTRACT

A circuit includes at least one bipolar transistor and at least one variable capacitance diode. The circuit is fabricated using a method whereby the bipolar transistor and variable capacitance diode are jointly produced on a common substrate.

12 Claims, 19 Drawing Sheets

(51) Int. Cl.
    *H01L 29/737*    (2006.01)
    *H01L 29/93*     (2006.01)

(56) References Cited

U.S. PATENT DOCUMENTS

| | | |
|---|---|---|
| 2003/0064575 A1 | 4/2003 | Losehand et al. |
| 2005/0161769 A1 | 7/2005 | Coolbaugh et al. |
| 2007/0224747 A1 | 9/2007 | Rochel et al. |
| 2008/0102593 A1 | 5/2008 | Meister et al. |
| 2011/0227130 A1 | 9/2011 | Liu et al. |
| 2014/0110761 A1 | 4/2014 | Yang et al. |
| 2015/0140771 A1 | 5/2015 | Fox et al. |
| 2019/0148531 A1 | 5/2019 | Gauthier |
| 2020/0066890 A1 | 2/2020 | Then et al. |

FOREIGN PATENT DOCUMENTS

| | | |
|---|---|---|
| CN | 107644901 A | 1/2018 |
| EP | 1229584 A2 | 8/2002 |
| EP | 3273483 A1 | 1/2018 |
| JP | S63148684 A | 6/1988 |
| KR | 20010073652 A | 8/2001 |
| WO | 9809335 A1 | 3/1998 |

OTHER PUBLICATIONS

Zampardi, Pete, et al: "Integration of Hyperabrupt Varactor Diodes with High-Speed Hererojunction Bipolar Transistors," Nov. 2017 (8 pages).
Joachim N Burghartz et al: "Integrated and Microwave Components in BiCMOS Technology", IEEE Transactions on Electron Devices, IEEE Service Center, Piscataway, NJ, US, vol. 43, N° 9, Sep. 1996.
First Office Action and Search Report for counterpart CN Appl. No. 202010584640.7, report dated Mar. 1, 2024, 9 pgs.

METHOD FOR PRODUCING A DIODE

CROSS REFERENCE TO RELATED APPLICATIONS

This application is a divisional of U.S. patent application Ser. No. 16/909,333, filed Jun. 23, 2020, which claims the priority benefit of French Application for Patent No. 1907150, filed on Jun. 28, 2019, the contents of which are hereby incorporated by reference in their entireties to the maximum extent allowable by law.

TECHNICAL FIELD

The present disclosure relates generally to methods for producing electronic components and, more particularly, to methods for producing variable capacitance diodes, also called varicap diodes or varactors.

BACKGROUND

A varicap diode is an electronic dipole provided with two terminals between which a p-n junction is formed.

When it is subjected to a direct polarization, the varicap diode has an operation similar to that of a conventional diode, that is to say, it turns on when a certain voltage threshold is exceeded.

Conversely, if an inverse polarization voltage is applied across its terminals, the varicap diode differs from a conventional diode in the off state in that it theoretically behaves not like an open circuit, but rather like a capacitor. In practice, a similar capacitive phenomenon also occurs, but to a lesser extent, for a reverse-biased conventional diode.

Whereas an effort is rather made to avoid this capacitive phenomenon in the case of a conventional diode, it is encouraged as much as possible in the case of a varicap diode.

There is a need in the art to increase the electrical capacity of the current varicap diodes. There is further a need to improve the methods making it possible to produce a varicap diode.

SUMMARY

One embodiment addresses all or some of the drawbacks of known varicap diodes and the known methods for producing same.

One embodiment provides a method for producing, jointly on a same (i.e., common or shared) substrate, at least one bipolar transistor and at least one variable capacitance diode.

According to one embodiment, said diode includes a p-n junction including: a first region with a first type of conductivity; and a second region with a second type of conductivity; said second region and an intrinsic base of said bipolar transistor being made during a same step.

According to one embodiment, said second region is made level with an extrinsic collector region constituting said first region.

According to one embodiment, said second region is made by epitaxy.

According to one embodiment, said diode includes a third region, with the first conductivity type, inserted between said first region and said second region.

According to one embodiment, said third region and an intrinsic collector of said transistor are made during a same step.

According to one embodiment, said third region is made by epitaxy.

According to one embodiment, the first type of conductivity is n and the second type of conductivity is p.

According to one embodiment, the first type of conductivity is p and the second type of conductivity is n.

According to one embodiment, said diode includes a varactor with hyperabrupt p-n junction.

One embodiment provides a method as described, having the following steps: providing a substrate, inside which at least a first extrinsic collector region has first and second sinks and inside which at least a second extrinsic collector region has a third sink; forming a stack having, from an upper surface of said substrate, first, second, third and fourth layers; making first and second openings in said second, third and fourth layers; producing first spacers inside said first and second openings; and making third and fourth openings in said first layer.

One embodiment provides a method as described, having the following steps: depositing, on the side of said upper surface, fifth and sixth layers; protecting a first area of said sixth layer by an area of a seventh layer; eliminating said sixth layer with the exception of said first area of said sixth layer and with the exception of second and third areas of said sixth layer; eliminating said area of said seventh layer; eliminating areas of said fifth layer that are not covered; depositing, on the side of said upper surface, an eighth layer; eliminating said eighth layer with the exception of an area of said eighth layer covered by an area of a ninth layer and eliminating said first area of said sixth layer; eliminating portions of areas of said fourth layer that are not covered and eliminating said area of said ninth layer; protecting the future diode and the future transistor, respectively, by first and second areas of a tenth layer and eliminating unprotected portions of first, second and third areas of said third and second layers; eliminating portions of areas of said first layer that are not covered and eliminating said first and second areas of said tenth layer; producing second spacers filling in right angles on the side of said upper surface; and producing first, second and third contacts, respectively, on said first, second and third sinks, producing a third contact on a first deposit, producing a fourth contact on a first portion of said area of said second layer, producing a fifth contact on a second portion of said area of said second layer and producing a sixth contact on said area of said eighth layer.

One embodiment provides a method as described, having a step consisting of filling in said third opening with a second deposit and with said first deposit and filling in said fourth opening with third and fourth deposits.

One embodiment provides a method as described, having a step consisting of filling in said third opening with said first deposit and filling in said fourth opening with a fifth deposit.

One embodiment provides an electronic circuit including at least one variable capacitance diode and at least one bipolar transistor, obtained using the method as described.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION

Figure 1:
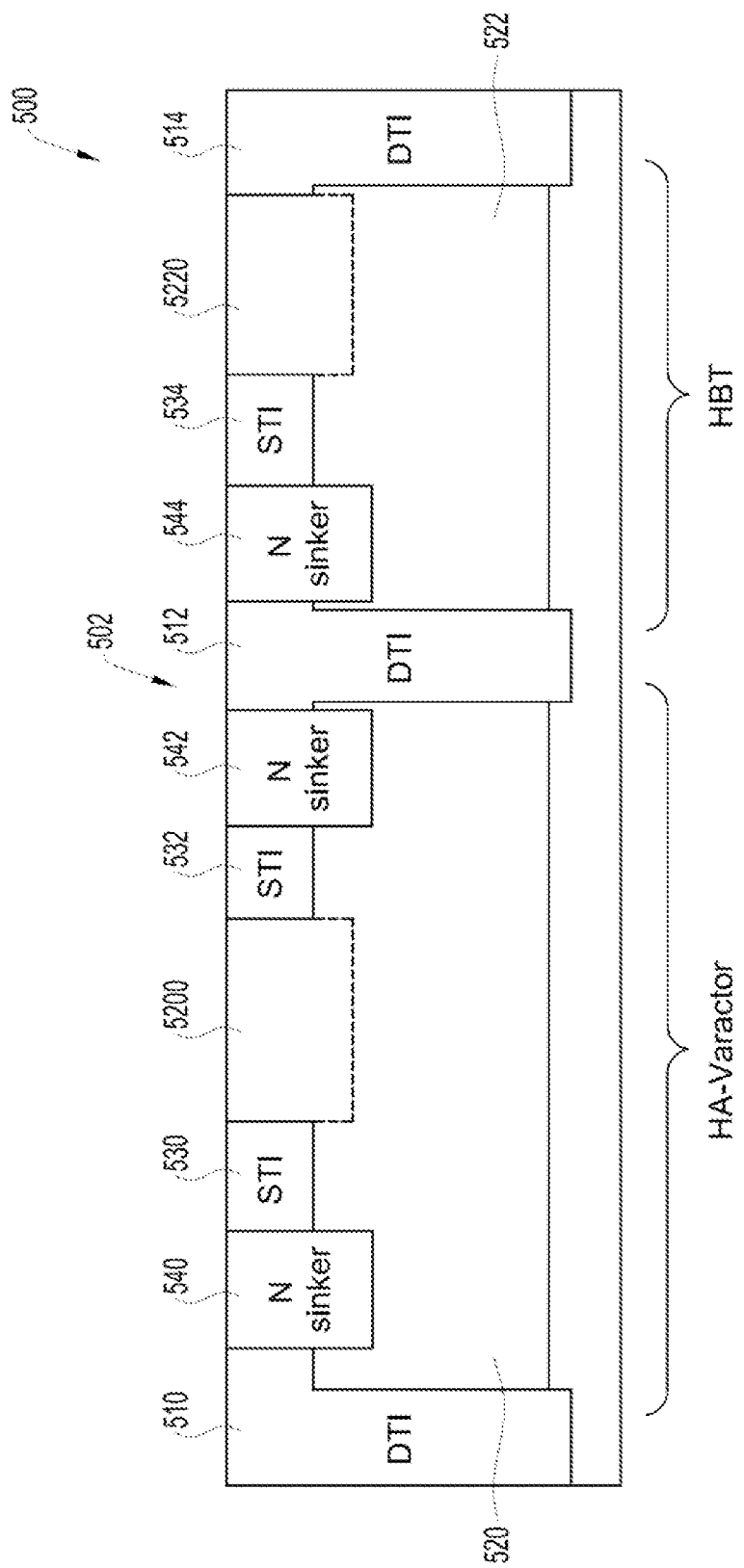
FIGS. 1-18 show, schematically and in cross-section, successive steps of an embodiment of a method for producing a varicap diode.

Like features have been designated by like references in the various figures. In particular, the structural and/or functional features that are common among the various embodiments may have the same references and may dispose identical structural, dimensional and material properties.

For the sake of clarity, only the operations and elements that are useful for an understanding of the embodiments described herein have been illustrated and described in detail. In particular, the method for preparing the substrate is not described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

FIGS. 1 to 18 below illustrate successive steps of an embodiment for a method for producing a varicap diode 100 or variable capacitance diode 100 or varistor 100. According to this embodiment, the varicap diode 100 is cointegrated with a Heterojunction Bipolar Transistor (HBT) 300, here a transistor 300 of the BiCMOS (Bipolar CMOS) type. In other words, the described embodiment makes it possible to produce, on a same (common or shared) substrate and jointly, a bipolar transistor 300 and a varicap diode 100.

To simplify, what is disclosed below in relation to FIGS. 1 to 18 uses the example of a method in which a single variable capacitance diode 100 and a single bipolar transistor 300 are made jointly. Nevertheless, it is understood that this method can be extended to the production, jointly and on a same substrate, of any number of bipolar transistors 300 and any number of variable capacitance diodes 100, these two numbers being able to be different.

FIG. 1 shows, schematically and in cross-section, a step of one embodiment of a method for producing a varicap diode.

According to this embodiment, one begins by providing a substrate 500 constituted, for example, by a monocrystalline silicon wafer. In FIG. 1, the substrate 500 has a first extrinsic collector region 520 and a second extrinsic collector region 522. These extrinsic collector regions 520 and 522 are, for example, produced through a very highly dosed ion implantation operation (about $10^{15}$ at/cm$^2$) in the substrate 500, followed by an epitaxy operation over a thickness of about 0.4 μm.

In FIG. 1, the substrate 500 further has first isolation substrates 510, 512 and 514, for example Deep Trench Isolation (DTI). These deep isolation trenches 510, 512 and 514 extend vertically from an upper surface 502 of the substrate 500. From left to right in FIG. 1, the trenches 510, 512 and 514 thus laterally delimit, in the substrate 500, two locations:

a first location (HA-Varactor), comprised between the trenches 510 and 512 (on the left, in FIG. 1), where it is desired to produce the variable capacitance diode 100, hereinafter referred to as "diode location"; and a second location (HBT), comprised between the trenches 512 and 514 (on the right, in FIG. 1), where one wishes to produce the bipolar transistor 300, referred to hereinafter by the expression "transistor location".

The deep isolation trenches 510, 512 and 514 of the substrate 500 separate, in FIG. 1, the two extrinsic collector regions 520 and 522. The regions 520 and 522 extend vertically, from the upper surface 502 of the substrate 500, to a depth of less than that of the deep isolation trenches 510, 512 and 514. More specifically:

the first extrinsic collector region 520, located at the diode location, is inserted between the deep isolation trenches 510 and 512; and the second extrinsic collector region 522, located at the transistor location, is inserted between the deep isolation trenches 512 and 514.

The first and second extrinsic collector regions 520, 522 are therefore separated from one another by a common isolation trench, in the case at hand the deep isolation trench 512 as illustrated in FIG. 1. These regions 520 and 522 are, for example, obtained by ion implantation, below the upper surface 502 of the substrate 500, of a dopant element with a first conductivity type, for example, type n (for example, phosphorus or arsenic). The first and second extrinsic collector regions 520, 522 then have an increasingly strong concentration of dopant element as one moves away from the upper surface 502 of the substrate 500.

According to one preferred embodiment, one area 5200 (shown in dotted lines, in FIG. 1), belonging to the first extrinsic collector region 520 and located below the upper surface 502 of the substrate 500, undergoes an additional ion implantation of a dopant element with the first conductivity type, here type n. This operation is, for example, done by arsenic ion implantation (AS$^+$ ions) with an energy of 130 keV, in order to obtain a surface doping in the order of $6 \times 10^{13}$ at/cm$^2$.

Likewise, one area 5220 (shown in dotted lines, in FIG. 1), belonging to the second extrinsic collector region 522 and located below the upper surface 502 of the substrate 500, undergoes a similar ion implantation. The ion implantations making it possible to form the areas 5200 and 5220 are preferably done at the same time.

The substrate 500 further includes second isolating structures 530, 532 and 534 (STI—Shallow Trench Isolation). These shallow isolation trenches 530, 532 and 534 extend vertically, from the upper surface 502 of the substrate 500, to a depth of less than that of the regions 520 and 522.

In the diode location, the trenches 530 and 532 border or adjoin the area 5200 of the region 520. The trenches 530 and 532 are therefore located on either side of the area 5200 (in FIG. 1, the trenches 530 and 532 are respectively alongside on the left and right sides of the area 5200).

In the transistor location, the trench 534 borders the area 5220 of the region 522 (in FIG. 1, the trench 534 is alongside the left side of the area 5220). The shallow isolation trenches 530, 532 and 534 have a depth of about 300 nm, preferably equal to 300 nm.

The substrate 500 also has first, second and third sinks 540, 542 and 544 (N sinker) that extend vertically, from the upper surface 502 of the substrate 500, to a depth greater than that of the areas 5200, 5220 and less than that of the regions 520 and 522. These sinks 540, 542 and 544 have the first conductivity type, here type n.

In the diode location, the first sink 540 is inserted between the deep isolation trench 510 and the shallow isolation trench 530 (in FIG. 1, the trenches 510 and 530 are respectively alongside on the left and right sides of the sink 540). The second sink 542 is inserted between the shallow isolation trench 532 and the deep isolation trench 512 (in FIG. 1, the trenches 532 and 512 are respectively alongside on the left and right sides of the sink 542). The first and second sinks 540 and 542 thus make it possible to contact the first extrinsic collector region 520 from the upper surface 502 of the substrate 500.

In the transistor location, the third sink 544 is inserted between the deep isolation trench 512 and the shallow isolation trench 534 (in FIG. 1, the trenches 512 and 534 are respectively alongside on the left and right sides of the sink 544). The third sink 544 thus makes it possible to contact the second extrinsic collector region 522 from the upper surface 502 of the substrate 500.

In the remainder of the description, the embodiment of the method described in relation with FIGS. 2 to 18 exclusively consists of performing operations above the upper surface 502 of the substrate 500. The substrate 500 of FIGS. 2 to 18 is therefore preferably identical to the substrate 500 as disclosed in relation with FIG. 1 throughout the entire method. To simplify, the substrate 500 will therefore not be described in detail again in the figures below.

Figure 2:
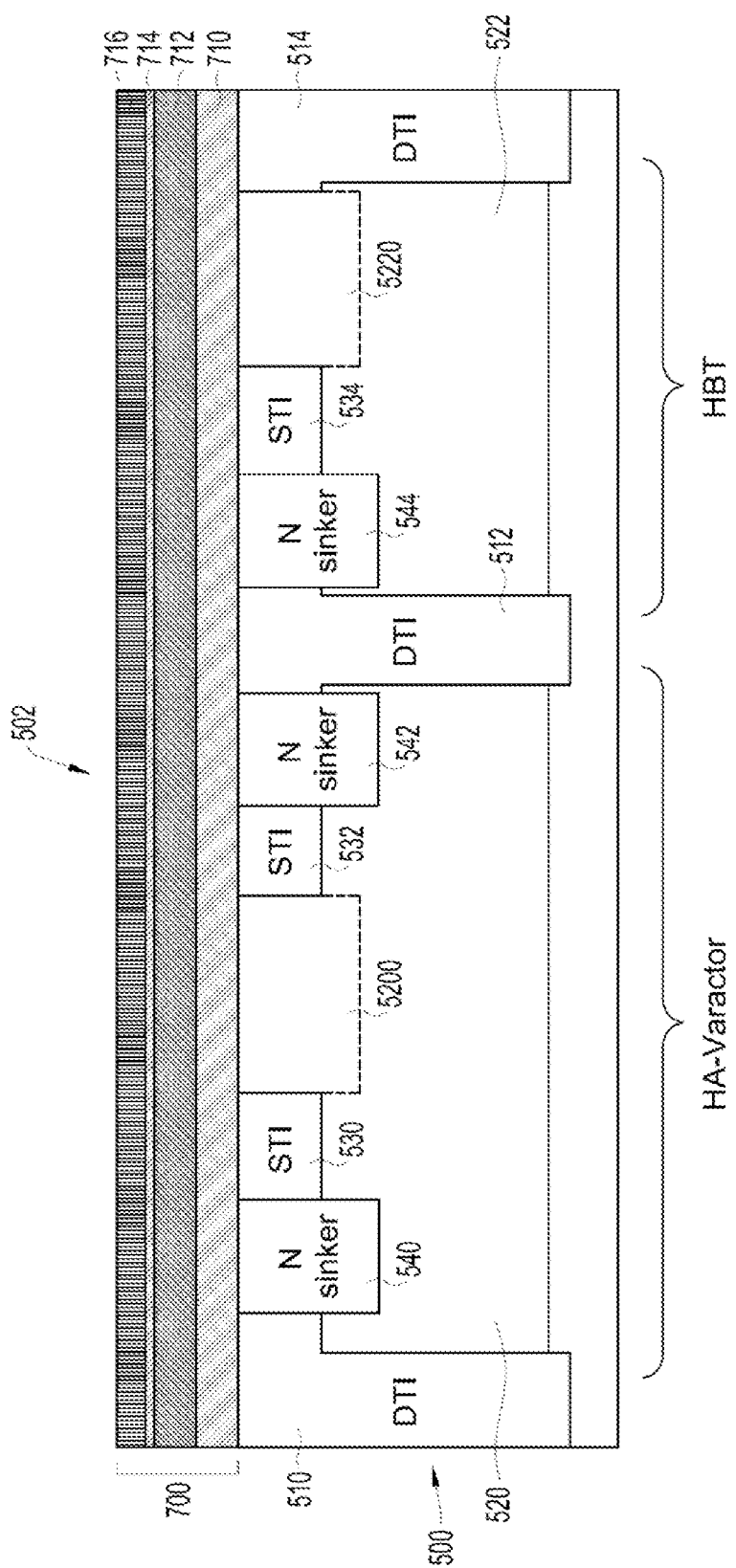

FIG. 2 shows, schematically and in cross-section, another step of the embodiment of the method for producing a varicap diode, made from the structure as disclosed in relation with FIG. 1.

During this step, a first stack 700 of four successive layers resting on top of one another is deposited over the entire upper surface 502 of the substrate 500. This first stack 700 more specifically has:
  a first layer 710 constituted by an oxide, for example, a silicon oxide, completely covering the upper surface 502 of the substrate 500;
  a second layer 712 constituted by polycrystalline silicon with a second conductivity type, here type p, completely covering the upper surface of the first layer 710;
  a third layer 714 constituted by an oxide, for example, the same oxide as that from which the first layer 710 is constituted, completely covering the upper surface of the second layer 712; and
  a fourth layer 716 constituted by a nitride, for example, a silicon nitride, completely covering the upper surface of the third layer 714.

According to this embodiment, the layers 710, 712, 714 and 716 making up the stack 700 have different thicknesses. For example:
  the first layer 710 has a thickness of between 30 nm and 70 nm, preferably about 50 nm, more preferably equal to 50 nm;
  the second layer 712 has a thickness of between 20 nm and 60 nm, preferably about 40 nm, more preferably equal to 40 nm;
  the third layer 714 has a thickness of between 2 nm and 8 nm, preferably about 5 nm, more preferably equal to 5 nm; and
  the fourth layer 716 has a thickness of between 20 nm and 60 nm, preferably about 40 nm, more preferably equal to 40 nm.

The layers 710, 712, 714 and 716 of the stack 700 are not shown to scale in FIG. 2.

Figure 3:
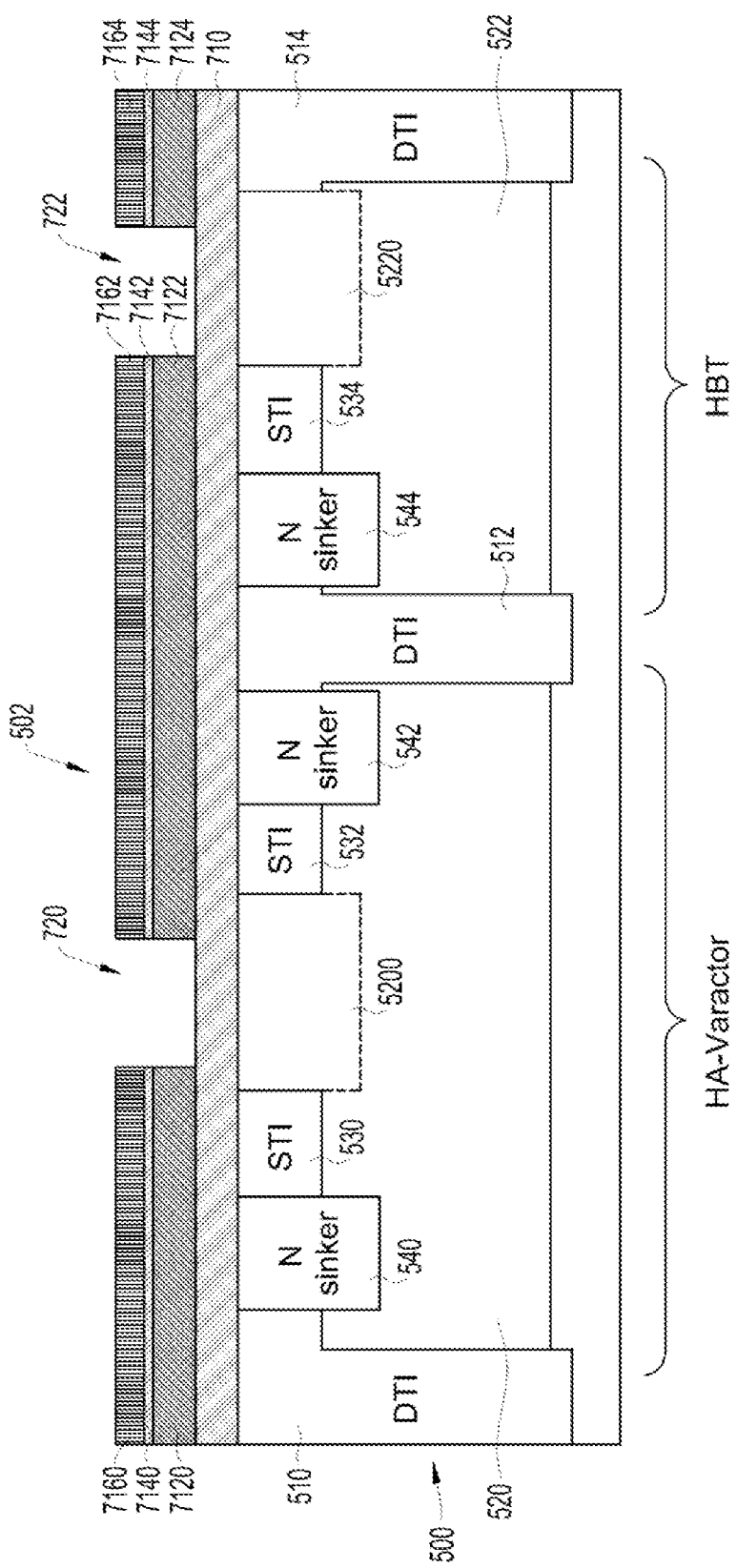

FIG. 3 shows, schematically and in cross-section, still another step of the embodiment of the method for producing a varicap diode, made from the structure as disclosed in relation with FIG. 2.

During this step, the stack 700 is etched locally in vertical alignment with the areas 5200 and 5220 and to a depth level with the upper surface of the first layer 710. This amounts to making, through the fourth, third and second layers 716, 714 and 712: a first vertical opening 720, located in the diode location; and a second vertical opening 722, located in the transistor location.

According to one preferred embodiment, the width of the first opening 720 is smaller than that of the area 5200 and the width of the second opening 722 is smaller than that of the area 5222. The first and second openings 720 and 722 are approximately centered relative to the areas 5200 and 5220, respectively.

In the example of FIG. 3, the second layer 712 is separated into first, second and third areas 7120, 7122 and 7124. More specifically: the areas 7120 and 7122 are located on either side of the opening 720 (in FIG. 3, the area 7120 is located to the left of the opening 720 while the area 7122 is located to the right of the opening 720); and the areas 7122 and 7124 are located on either side of the opening 722 (in FIG. 3, the area 7122 is located to the left of the opening 722 while the area 7124 is located to the right of the opening 722).

Still in the example of FIG. 3, the third layer 714 is separated into first, second and third areas 7140, 7142 and 7144. More specifically: the areas 7140 and 7142 are located on either side of the opening 720 (in FIG. 3, the area 7140 is located to the left of the opening 720 while the area 7142 is located to the right of the opening 720); and the areas 7142 and 7144 are located on either side of the opening 722 (in FIG. 3, the area 7142 is located to the left of the opening 722 while the area 7144 is located to the right of the opening 722).

Still in the example of FIG. 3, the fourth layer 716 is separated into first, second and third areas 7160, 7162 and 7164. More specifically: the areas 7160 and 7162 are located on either side of the opening 720 (in FIG. 3, the area 7160 is located to the left of the opening 720 while the area 7162 is located to the right of the opening 720); and the areas 7162 and 7164 are located on either side of the opening 722 (in FIG. 3, the area 7162 is located to the left of the opening 722 while the area 7164 is located to the right of the opening 722).

The second areas 7122, 7142 and 7162 of the layers 712, 714 and 716, respectively, are therefore inserted between the two openings 720 and 722. The first layer 710 remains intact all throughout the step described in relation with FIG. 3.

Figure 4:
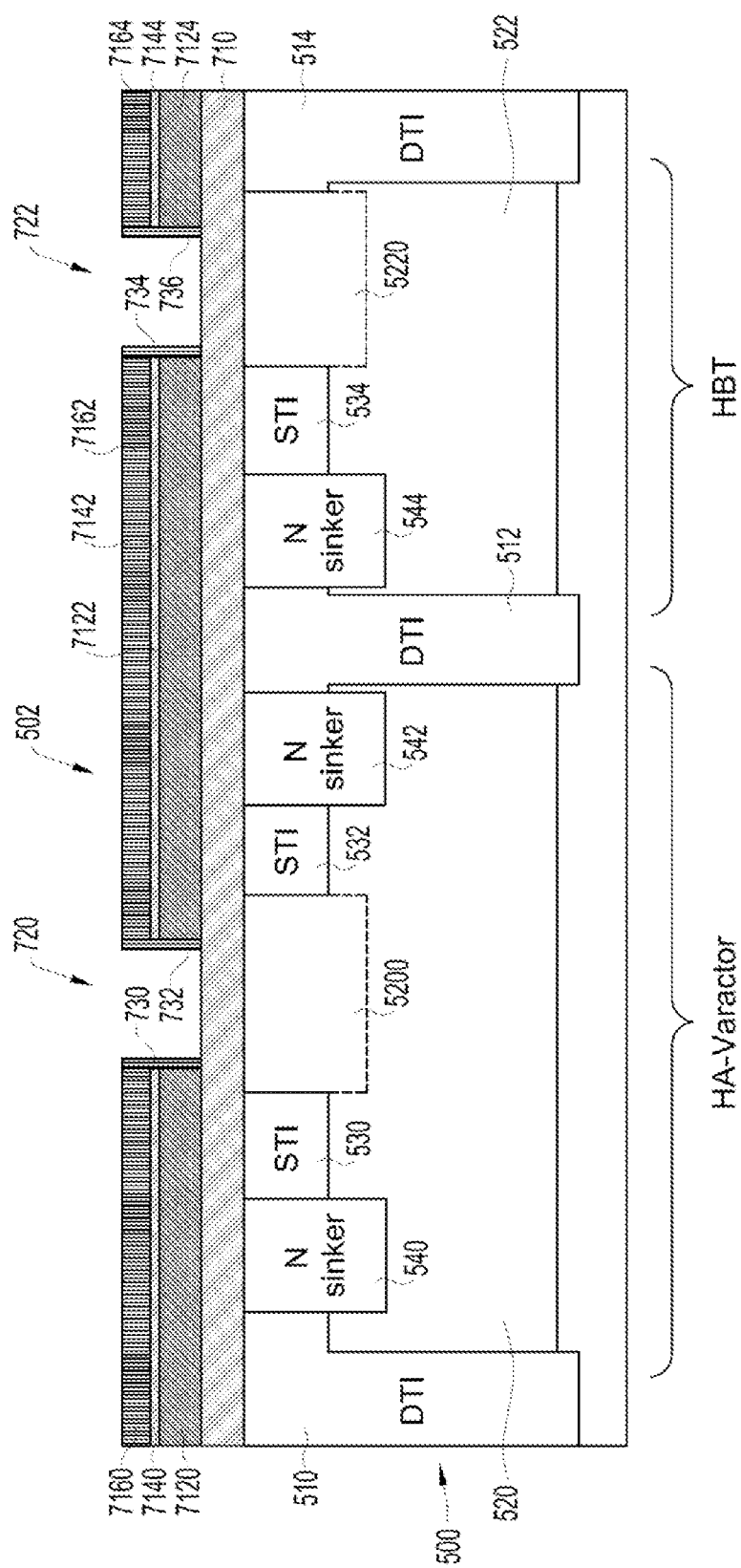

FIG. 4 shows, schematically and in cross-section, still another step of the embodiment of the method for producing a varicap diode and bipolar transistor, made from the structure as disclosed in relation with FIG. 3.

During this step, first spacers 730, 732, 734 and 736 are produced inside openings 720 and 722 made beforehand in the stack 700. The spacers 730 and 732 completely border the lateral walls of the opening 720. Likewise, the spacers 734 and 736 completely border the lateral walls of the opening 722. More specifically, in FIG. 4: the spacer 730 completely covers the lateral faces of the first areas 7120, 7140 and 7160 of the layers 712, 714 and 716 that constitute inner walls of the opening 720; the spacer 732 completely covers the lateral faces of the second areas 7122, 7142 and 7162 of the layers 712, 714 and 716 that constitute inner walls of the opening 720; the spacer 734 completely covers the lateral faces of the second areas 7122, 7142 and 7162 of the layers 712, 714 and 716 that constitute inner walls of the opening 722; and the spacer 736 completely covers the lateral faces of the third areas 7124, 7144 and 7164 of the layers 712, 714 and 716 that constitute inner walls of the opening 722.

The spacers 730 and 732 are not contiguous, that is to say, they only partially cover the free upper surface of the first layer 710 at the bottom of the first opening 720. Likewise, the spacers 734 and 736 are not contiguous, that is to say, they only partially cover the free upper surface of the first layer 710 at the bottom of the second opening 722.

The first spacers 730, 732, 734 and 736 are flush with the upper surface of the first, second and third areas 7160, 7162 and 7164 of the fourth layer 716.

These first spacers 730, 732, 734 and 736 are constituted by nitride, for example the same nitride as that from which the fourth layer 716 is constituted. If applicable, it can be considered that: the spacer 730 extends the first area 7160 of the fourth layer 716 over an entire lateral wall of the opening 720 (in FIG. 4, the left lateral wall of the opening 720); the spacer 732 extends the second area 7162 of the fourth layer 716 over the other entire lateral wall of the opening 720 (in FIG. 4, the right lateral wall of the opening 720); the spacer 734 extends the second area 7162 of the fourth layer 716 over an entire lateral wall of the opening 722 (in FIG. 4, the left lateral wall of the opening 722); and the spacer 736 extends the third area 7164 of the fourth layer 716 over the other entire lateral wall of the opening 722 (in FIG. 4, the right lateral wall of the opening 722).

Figure 5:
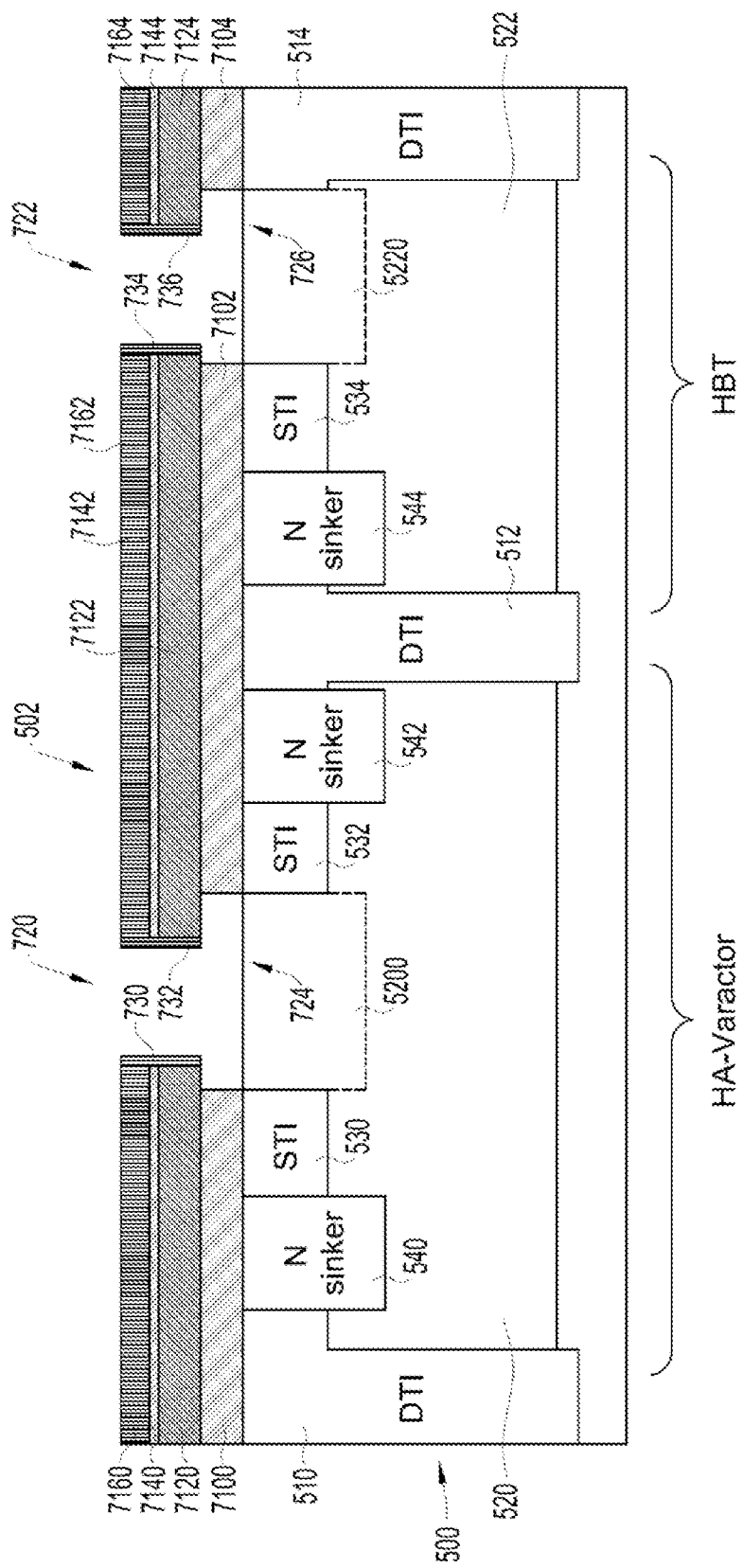

FIG. 5 shows, schematically and in cross-section, still another step of the embodiment of the method for producing a varicap diode and bipolar transistor, made from the structure as disclosed in relation with FIG. 4.

During this step, the first layer 710 is etched locally through the openings 720 and 722 to a depth which is level with the areas 5200 and 5220 to the upper surface 502 of the substrate 500. This amounts to making, in the first layer 710: a third vertical opening 724, located in the diode location, which extends from opening 720; and a fourth vertical opening 726, located in the transistor location, which extends from opening 722.

According to this embodiment, the width of the third opening 724 is larger than that of the first opening 720 and the width of the fourth opening 726 is larger than that of the second opening 722. The width of the third opening 724 is preferably equal to that of the area 5200 of the first extrinsic collector region 520. Likewise, the width of the fourth opening 726 is preferably equal to that of the area 5220 of the second extrinsic collector region 522. The third and fourth openings 724 and 726 are approximately centered relative to the areas 5200 and 5220, respectively.

In other words, this amounts to respectively extending the first and second openings 720 and 722 by the third and fourth openings 724 and 726, made in the first layer 710. One thus deoxidizes (that is to say, removes the oxide) from the parts of the upper surface 502 of the substrate 500 where the first and second areas 5200 and 5220 of the extrinsic collector regions 520 and 522 are flush. The oxide is preferably removed locally through a wet etching method.

In the example of FIG. 5, the first layer 710 is separated into first, second and third areas 7100, 7102 and 7104. More specifically: the areas 7100 and 7102 are located on either side of the opening 724 (in FIG. 5, the area 7100 is located to the left of the opening 724 while the area 7102 is located to the right of the opening 724); and the areas 7102 and 7104 are located on either side of the opening 726 (in FIG. 5, the area 7102 is located to the left of the opening 726 while the area 7104 is located to the right of the opening 726).

The second area 7102 of the first layer 710 is therefore inserted between the two openings 724 and 726.

Figure 6:
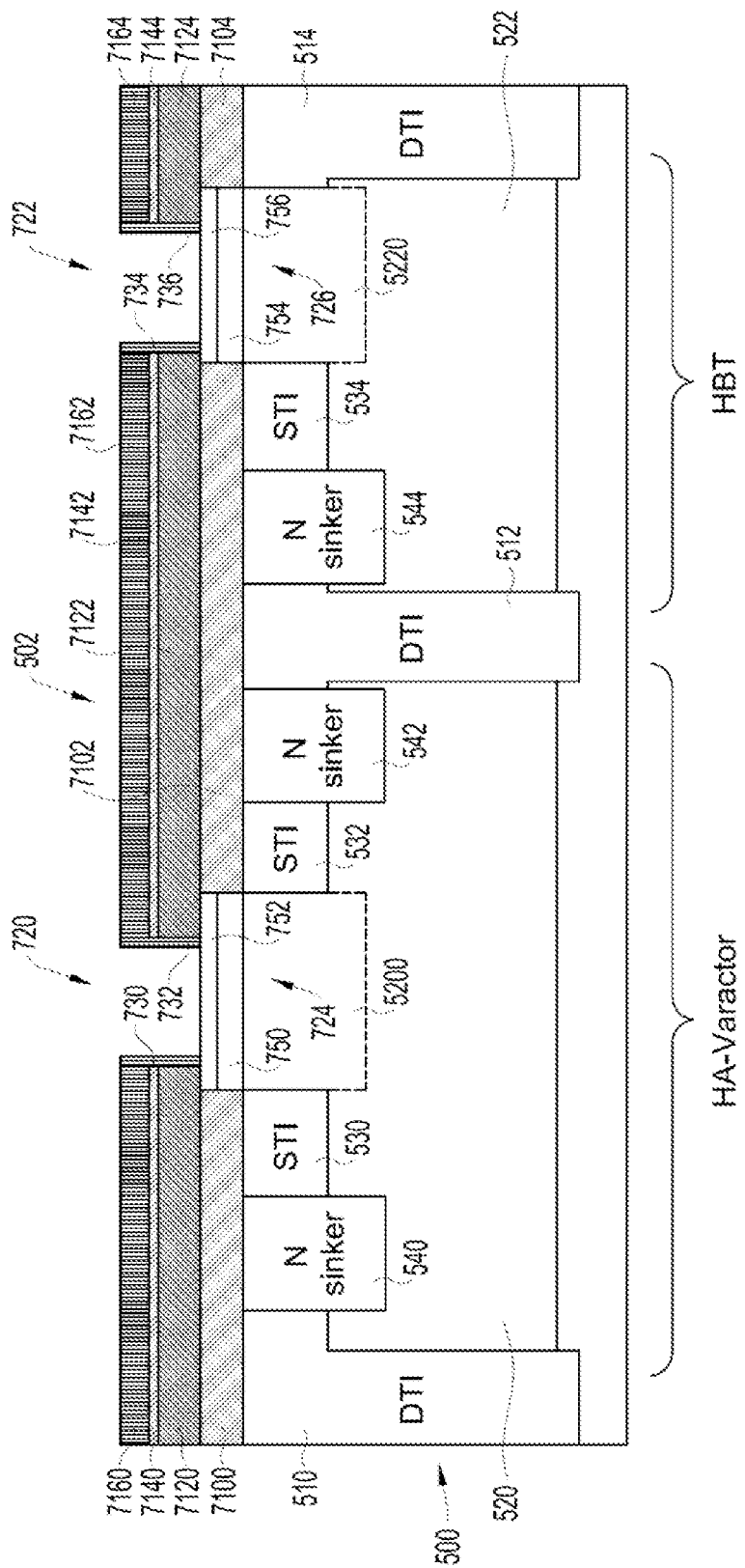

FIG. 6 shows, schematically and in cross-section, still another step of the embodiment of the method for producing a varicap diode and bipolar transistor, made from the structure as disclosed in relation with FIG. 5.

During this step, the third opening 724 is completely filled (filled in): by a first deposit 750, forming a region 750 covering the entire upper surface of the area 5200 belonging to the first extrinsic collector region 520; and by a second deposit 752, forming a region 752 covering the entire upper surface of the first deposit 750.

Likewise, during this step, the fourth opening 726 is completely filled: by a third deposit 754, covering the entire upper surface of the area 5220 belonging to the second extrinsic collector region 522; and by a fourth deposit 756, covering the entire upper surface of the third deposit 754.

In this example: the first and second deposits 750 and 752 are inserted between the first and second areas 7100 and 7102 of the first layer 710; and the third and fourth deposits 754 and 756 are inserted between the second and third areas 7102 and 7104 of the first layer 710.

In FIG. 6, the first and second deposits 750 and 752 jointly have a total thickness substantially equal to that of the areas 7100, 7102 and 7104 of the first layer 710, preferably equal to that of the areas 7100, 7102 and 7104 of the first layer 710. Likewise, in FIG. 6, the third and fourth deposits 754 and 756 jointly have a total thickness substantially equal to that of the areas 7100, 7102 and 7104 of the first layer 710, preferably equal to that of the areas 7100, 7102 and 7104 of the first layer 710.

In other words, the first and third deposits 750 and 754 each have a thickness smaller than that of the areas 7100, 7102 and 7104 of the first layer 710. The second and fourth deposits 752 and 756 illustrated in FIG. 6 also each have a thickness smaller than that of the areas 7100, 7102 and 7104 of the first layer 710.

The first deposit 750 is about two times thinner than the second deposit 752, preferably two times thinner than the second deposit 752. Likewise, the third deposit 754 is about two times thinner than the fourth deposit 756, preferably two times thinner than the fourth deposit 756.

The first deposit 750, the second deposit 752, the third deposit 754 and the fourth deposit 756 are not shown to scale in FIG. 6 and in FIGS. 7 to 18 below.

The thickness of the deposits 750 and 754 is, in this example, about 16.7 nm, preferably equal to 16.7 nm. The thickness of the deposits 752 and 756 is, in this example, about 33.3 nm, preferably equal to 33.3 nm.

The first and third deposits 750 and 754 are constituted by a doped material with the first conductivity type, here type n. These first and third deposits 750 and 754 are preferably constituted from the same material as that from which the areas 5200 and 5220 of the first and second extrinsic collector regions 520 and 522 are constituted.

The second and fourth deposits 752 and 756 are constituted by a doped material with the second conductivity type, here type p. These second and fourth deposits 752 and 756 are preferably constituted from the same material as that from which the second layer 712 is constituted, with the difference that the second deposit 752 and the fourth deposit 756 are preferably constituted from monocrystalline material, while the second layer 712 is constituted from polycrystalline material.

The second deposit 752 therefore forms, with the first deposit 750 located in the diode location, a first p-n junction. Likewise, the fourth deposit 756 forms, with the third deposit 754 located in the transistor location, a second p-n junction.

The deposits 750, 752, 754 and 756 are preferably produced by epitaxy (in other words, they are obtained by epitaxial growth). In particular: the first and third deposits 750 and 754 can be produced at the same time; and the second and fourth deposits 752 and 756 can be produced at the same time, after having produced the deposits 750 and 754.

One thus obtains a very pronounced interface between the first deposit 750 and the second deposit 752. This makes it possible to ensure that the first p-n junction is characterized by a dopant profile varying very significantly near this interface. This is then called "abrupt" p-n junction, in other words a p-n junction having abrupt dopant profiles near the interface.

Likewise, one thus obtains a very pronounced interface between the third deposit 754 and the fourth deposit 756. This makes it possible to ensure that the second p-n junction is characterized by a dopant profile varying very significantly near this interface ("abrupt" p-n junction).

According to this embodiment, the area 5220 of the second extrinsic collector region 522 and the third deposit 754 both constitute an intrinsic collector of the future bipolar transistor 300. The fourth deposit 756 in turn constitutes an intrinsic base of the future bipolar transistor 300.

Figure 7:
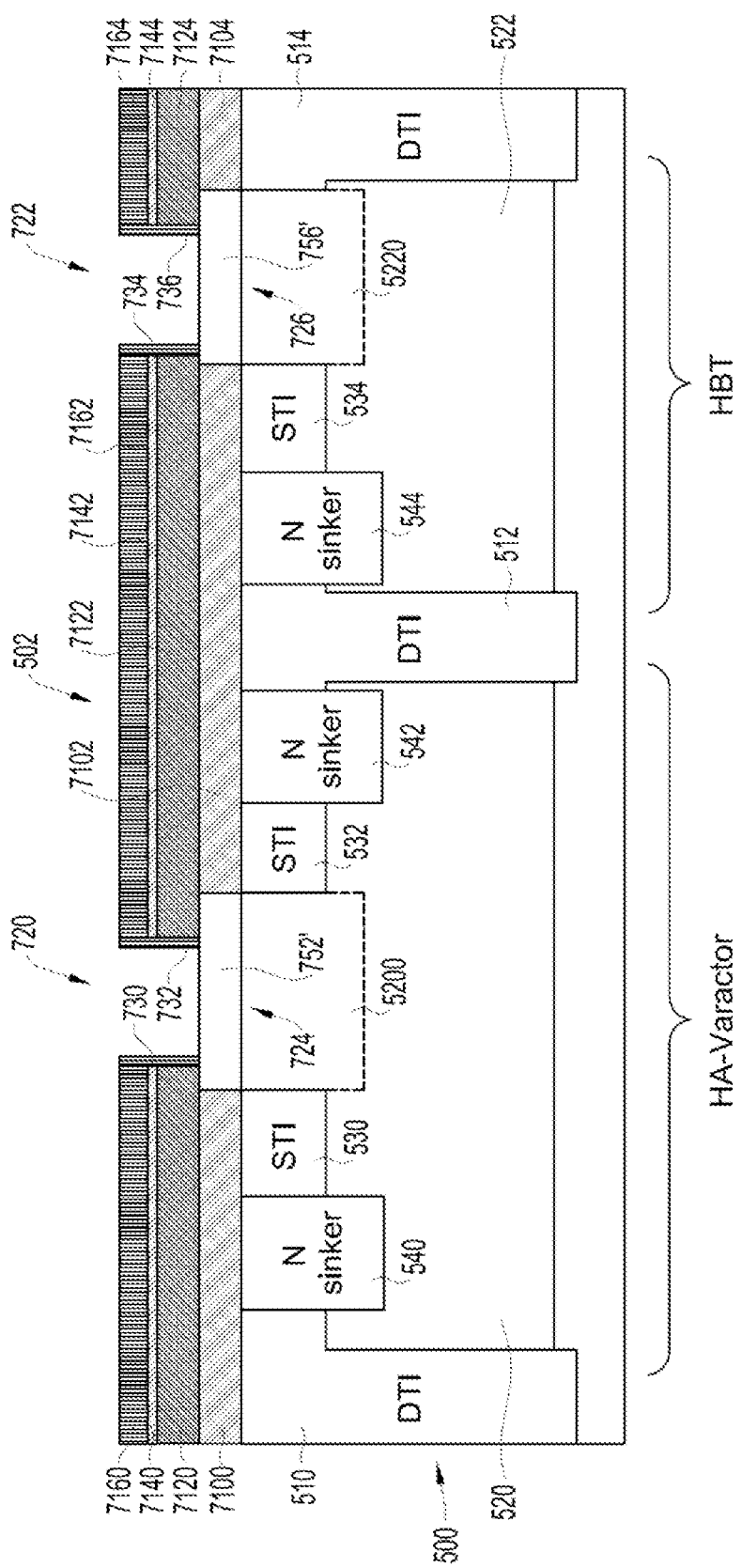

FIG. 7 shows, schematically and in cross-section, another variant of the embodiment of the method for producing a varicap diode and bipolar transistor, made from the structure as disclosed in relation with FIG. 5.

This variant primarily differs from the step disclosed in relation with FIG. 6 in that the third and fourth openings 724 and 726 here are respectively completely filled (or filled in) by fifth and sixth deposits 752' and 756'. These deposits 752' and 756' are preferably of the same nature as the second and fourth deposits 752 and 756 previously described. The fifth deposit 752' thus forms a region 752' of the same nature as the region 752. In other words, this is equivalent to a situation in which the first and third deposits 750 and 754 are not produced and where the third and fourth openings 724 and 726 are completely filled in by the second and fourth deposits 752 and 756, respectively.

Thus, according to this variant, the deposits 752' and 756' respectively cover the entire upper surfaces of the areas 5200 and 5220 belonging to the first and second extrinsic collector regions 520 and 522. In FIG. 7: the fifth deposit 752' is inserted between the first and second areas 7100 and 7102 of the first layer 710; and the sixth deposit 756' is inserted between the second and third areas 7102 and 7104 of the first layer 710.

The fifth deposit 752' has, in FIG. 7, a thickness that is substantially equivalent to the total thickness of the first and second deposits 750 and 752 of FIG. 6. Likewise, the sixth deposit 756' has, in FIG. 7, a thickness that is substantially equivalent to the total thickness of the third and fourth deposits 754 and 756 of FIG. 6. Thus, the fifth and sixth deposits 752' and 756' illustrated in FIG. 7 have a thickness greater than that of the second and fourth deposits 752 and 756 illustrated in FIG. 6.

The deposits 752' and 756' here have a thickness substantially equal to that of the areas 7100, 7102 and 7104 of the first layer 710. The thickness of the deposits 752' and 756' is, in this example, about 50 nm, preferably equal to 50 nm.

The fifth and sixth deposits 752' and 756' are constituted by a doped material with the second conductivity type, here type p. These fifth and sixth deposits 752' and 756' are preferably constituted from the same material as that from which the second and fourth deposits 752 and 756 are constituted that are disclosed in relation with FIG. 6.

The fifth deposit 752' therefore forms, with the first extrinsic collector region 520 located in the diode location, a first p-n junction. Likewise, the sixth deposit 756' forms, with the second extrinsic collector region 522 located in the transistor location, a second p-n junction.

More specifically, according to the preferred embodiment where the first and second extrinsic collector regions 520 and 522 respectively have areas 5200 and 5220: the fifth deposit 752' forms, with the area 5200 of the first extrinsic collector region 520, the first p-n junction; and the sixth deposit 756' forms, with the area 5220 of the second extrinsic collector region 522, the second p-n junction.

According to this variant, the sixth deposit 756' therefore in turn constitutes an intrinsic base of the future bipolar transistor 300. The area 5220 of the second extrinsic collector region 522 constitutes an intrinsic collector of the future bipolar transistor 300.

The fifth and sixth deposits 752' and 756' are preferably produced by epitaxy (in other words, they are obtained by epitaxial growth).

Relative to the embodiment illustrated in relation with FIG. 6, this variant has the advantage of not having an operation to produce first and third deposits 750 and 754. One thus reduces the total number of steps of the method, therefore the time allocated to its implementation.

One obtains, still in this variant, a marked interface between the fifth deposit 752' and the area 5200 (that is to say, between the fifth deposit 752' and the first extrinsic collector region 520). This makes it possible to ensure that the first p-n junction is characterized by a dopant profile varying significantly near this interface (abrupt p-n junction).

One also obtains a marked interface between the sixth deposit 756' and the area 5200 (that is to say, between the sixth deposit 756' and the first extrinsic collector region 520). This makes it possible to ensure that the second p-n junction is characterized by a dopant profile varying significantly near this interface (abrupt p-n junction).

It is assumed hereinafter that the variant disclosed in relation with FIG. 7 is not selected in the embodiment of the described method. However, the adaptation of the steps that follow to a case where the first and third deposits 750 and 754 are not present, that is to say, when the third and fourth openings 724 and 726 are respectively filled in by deposits 752' and 756' as disclosed in relation with FIG. 7 (or filled in only by deposits 752 and 756, respectively), is within the capabilities of those skilled in the art from the information supplied below.

Figure 8:
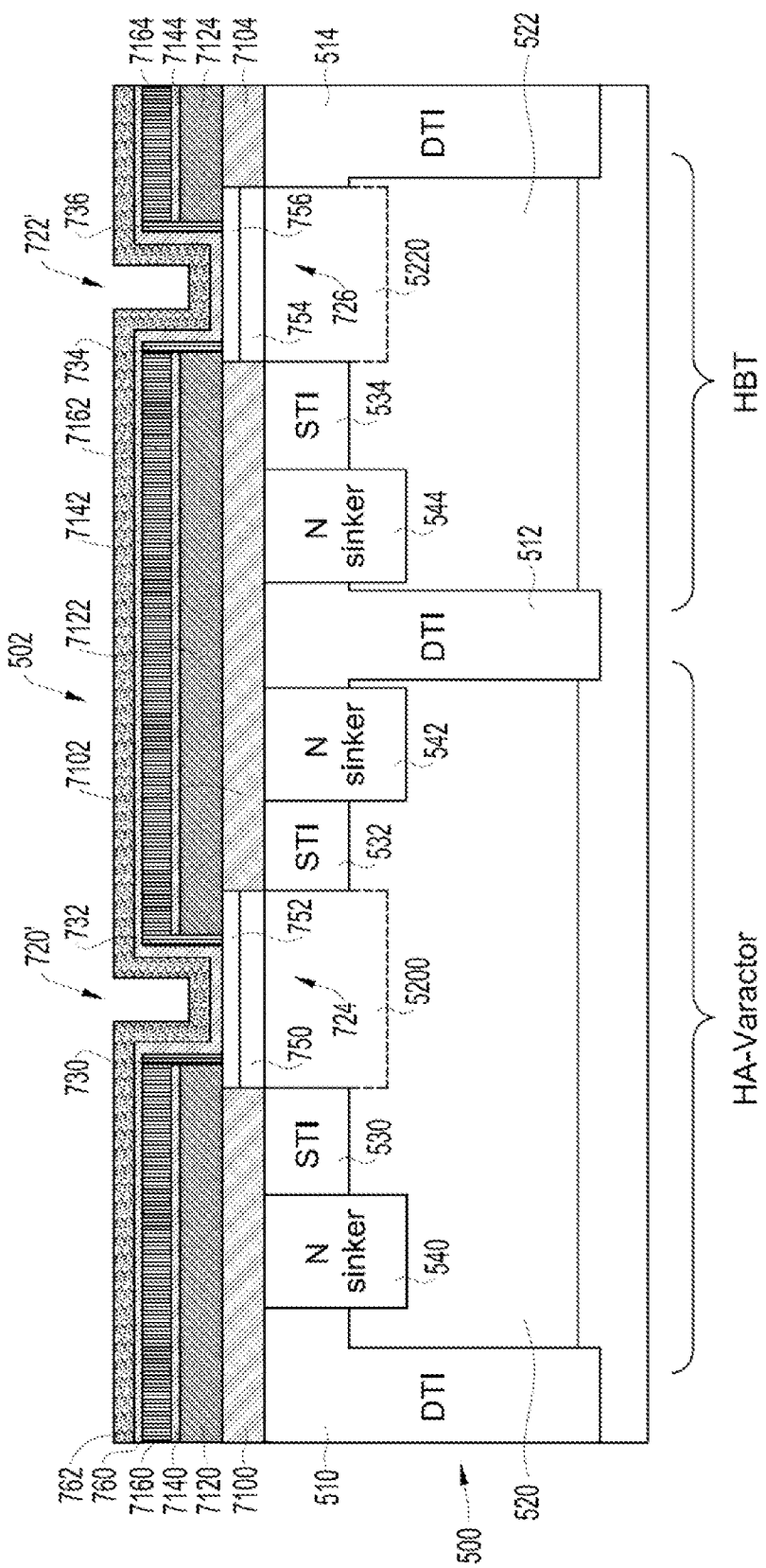

FIG. 8 shows, schematically and in cross-section, still another step of the embodiment of the method for producing a varicap diode and bipolar transistor, made from the structure as disclosed in relation with FIG. 6 (or alternatively, FIG. 7).

During this step, deposited on the structure, on the side of the upper surface 502 of the substrate 500 (at the top, in FIG. 8), are: a fifth layer 760 constituted by an oxide, for example, the same oxide as that from which the first layer 710 is constituted; and a sixth layer 762 constituted by polycrystalline silicon (poly-Si) or, preferably, amorphous silicon (a-Si).

More specifically, the fifth layer 760 covers: the first, second and third areas 7160, 7162 and 7164 of the fourth layer 716; the upper faces and the free lateral faces of the first spacers 730, 732, 734 and 736; the free upper surface of the second deposit 752; and the free upper surface of the fourth deposit 756.

The sixth layer 762 completely covers the fifth layer 760. This sixth layer 762 is a sacrificial layer making it possible to protect parts of the structure during the method for joint production of the variable capacitance diode 100 and the bipolar transistor 300.

The fifth and sixth layers 760 and 762 do not completely fill in the first and second openings 720 and 722. In other words, these layers 760 and 762 have a total thickness strictly smaller than: half the distance separating the first spacers 730 and 732 located in the diode location; and half the distance separating the first spacers 734 and 736 located in the transistor location.

In other words, the first opening 720 is partially filled in by the two spacers 730 and 732 and by the fifth and sixth layers 760 and 762, thus forming a fifth opening 720' corresponding to a reduced opening 720. Likewise, the second opening 722 is partially filled in by the two spacers 734 and 736 and by the fifth and sixth layers 760 and 762, thus forming a sixth opening 722' corresponding to a reduced opening 722.

According to this embodiment, the layers 760 and 762 have different thicknesses. In this example: the fifth layer 760 has a thickness of between 2 nm and 6 nm, preferably of about 4 nm, more preferably equal to 4 nm; and the sixth layer 762 has a thickness of between 30 nm and 70 nm, preferably about 50 nm, more preferably equal to 50 nm.

The layers 760 and 762 are not shown to scale in FIG. 8.

Figure 9:
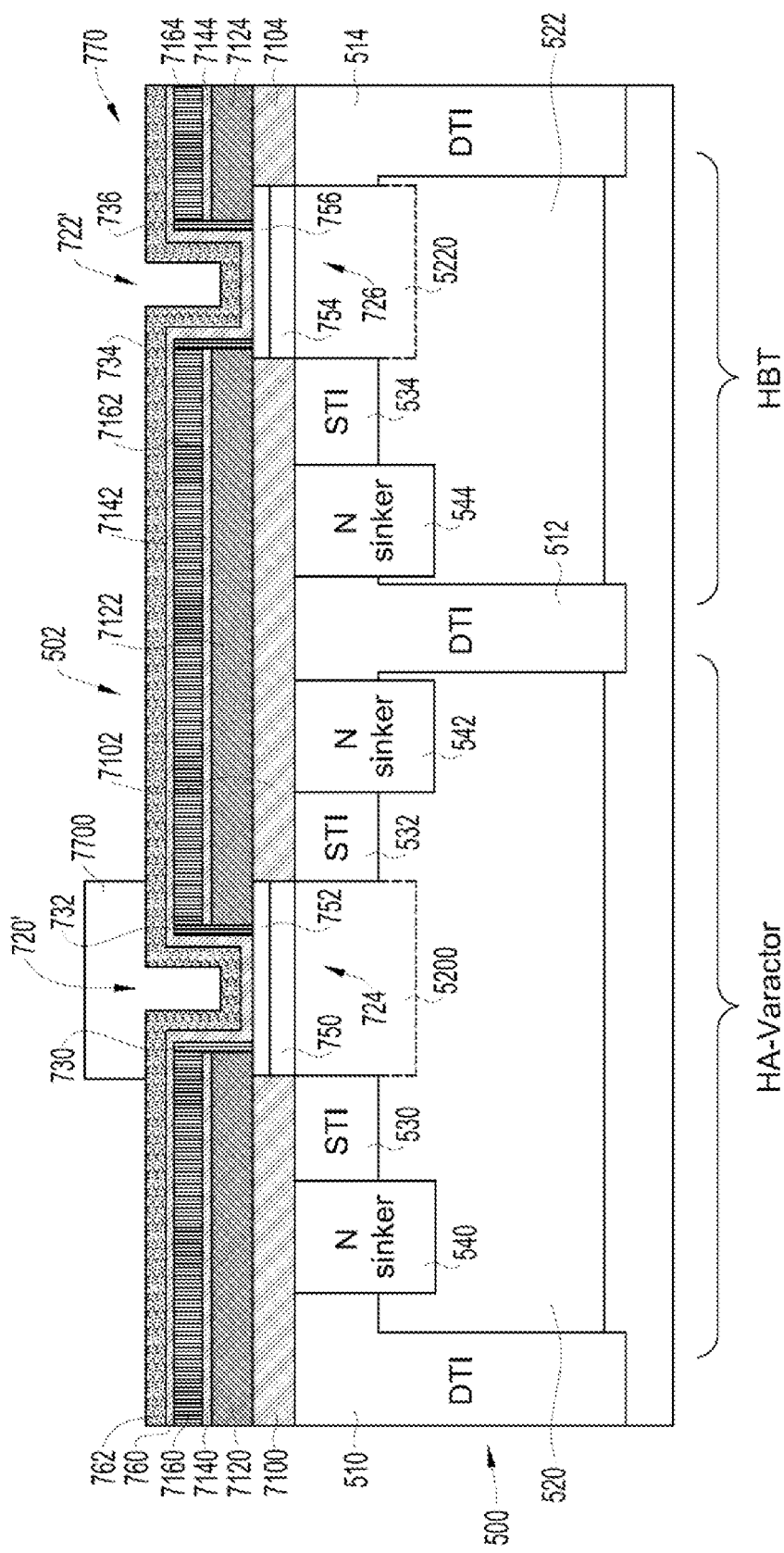

FIG. 9 shows, schematically and in cross-section, still another step of the embodiment of the method for producing a varicap diode and bipolar transistor, made from the structure as disclosed in relation with FIG. 8.

During this step, the future variable capacitance diode 100 is protected with a view to later steps. This protection is, for example, produced by: a first operation consisting of depositing, on the entire upper surface of the sixth layer 762, a seventh layer 770 (only the portion 7700 of which remains at the end of the step and is visible), constituted by a photolithography photoresist, with a sufficient thickness to fill in the fifth opening 720'; a second operation consisting of exposing, through a mask, this seventh photoresist layer 770; and a third operation consisting of eliminating, by etching, exposed parts of the seventh layer 770 so as to keep only, in the diode location, an area 7700 (not exposed) of this layer 770.

The area 7700 of the seventh layer 770 covers an area of the sixth layer 762 located level with the area 5200 of the first extrinsic collector region 520. As illustrated in FIG. 9, this area 7700 is T-shaped. A vertical bar of this T completely fills (or fills in) the fifth opening 720', while a horizontal bar of this T extends (or is prolonged) over parts of the upper surface of the sixth layer 762 that are adjacent to the fifth opening 720'.

Figure 10:
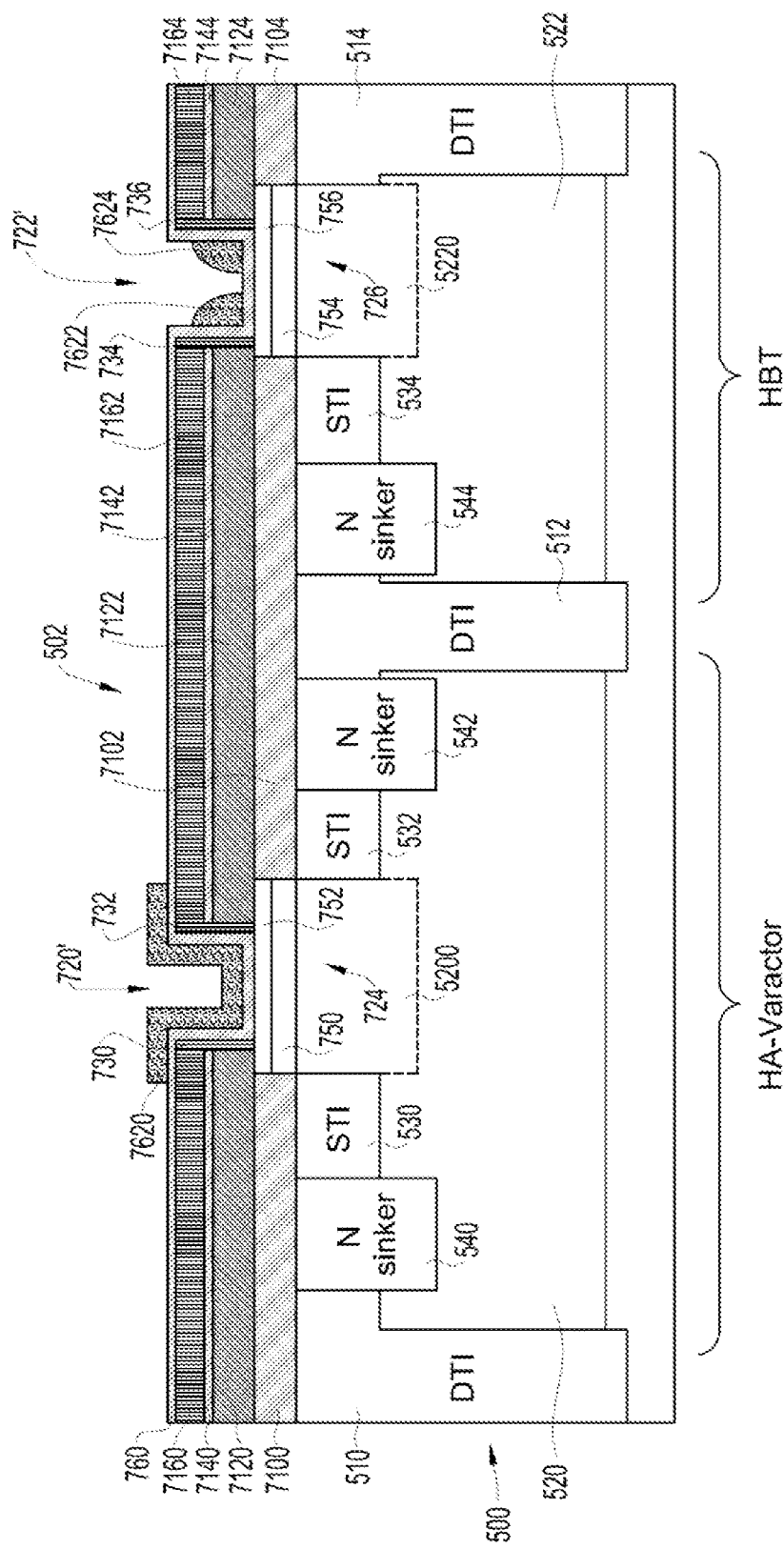

FIG. 10 shows, schematically and in cross-section, still another step of the embodiment of the method for producing a varicap diode and bipolar transistor, made from the structure as disclosed in relation with FIG. 9.

During this step, an etching operation is performed, for example, by a dry etching method (plasma etching, for example), in order to eliminate most of the unprotected areas of the sixth layer 762. Preferably, anisotropic etching is done such that this etching preferably (or selectively, or primarily) causes horizontal areas of the sixth layer 762 to disappear relative to vertical areas of this sixth layer 762.

In the diode location, the area 7700 of the seventh layer 770 covers the vertical areas of the sixth layer 762 (these areas are located within the fifth opening 720', which is completely filled by the area 7700). Horizontal areas of the sixth layer 762 not covered by the area 7700 are therefore eliminated, still in the diode location.

In the transistor location, the vertical areas of the sixth layer 762 are not covered (these areas are located within the sixth opening 722', which is completely free). Horizontal areas of the sixth layer 762 are therefore primarily eliminated, still in the transistor location. Vertical areas of the sixth layer 762 are also eliminated for the minority. The elimination by etching of the sixth layer 762 is controlled such that only two second and third areas 7622 and 7624 of the sixth layer 762 remain within the sixth opening 722'.

The area 7700 is next removed from the seventh layer 770. This area 7700 is not shown in FIG. 10, since it is removed at the end of the etching step above.

As illustrated in FIG. 10, only a first area 7620 of the sixth layer 762 located level with the area 7700 of the seventh layer 770 is thus retained in the diode location. Only the second and third areas 7622 and 7624 of the sixth layers 762 are retained in the transistor location. These second and third areas 7622 and 7624 of the sixth layer 762 respectively constitute two first parts 7622 and 7624 of second spacers 780 and 782 (not visible in FIG. 10) to be formed in order to produce the bipolar transistor 300.

The first parts 7622 and 7624 of the second spacers 780 and 782 approximately have, in the example of FIG. 10, a "quarter-circle" shape. These parts 7622 and 7624 are located on either side inside the sixth opening 722' (in FIG. 10, the part 7622 of the future spacer (780, FIG. 11) is located on the left side inside the opening 722' while the part 7624 of the future spacer (782, FIG. 11) is located on the right side inside the opening 722'). The parts 7622 and 7624 are not contiguous, that is to say, they only partially cover the free upper surface of the fifth layer 760 at the bottom of the sixth opening 722'.

Still in the example of FIG. 10, the first parts 7622 and 7624 of the spacers 780 and 782 are such that: the first part 7622 of the spacer 780 partially covers an inner vertical wall of the sixth opening 722' (in FIG. 10, the part 7622 partially covers the left wall of the opening 722'); and the first part 7624 of the spacer 782 partially covers the other inner vertical wall of the sixth opening 722' (in FIG. 10, the part 7624 partially covers the right wall of the opening 722').

Figure 11:
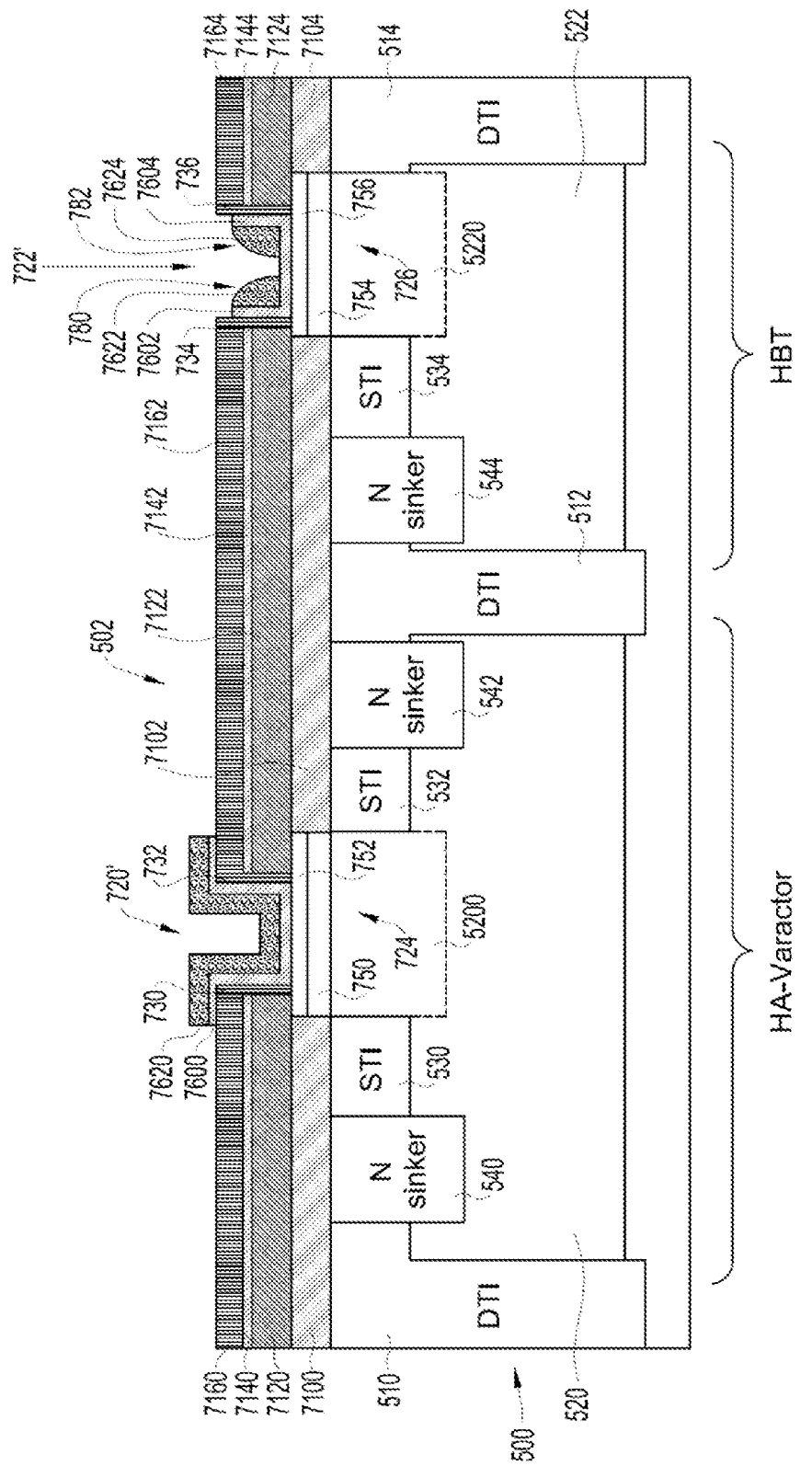

FIG. 11 shows, schematically and in cross-section, still another step of the embodiment of the method for producing a varicap diode and bipolar transistor, made from the structure as disclosed in relation with FIG. 10.

During this step, areas of the fifth layer 760 are eliminated that are not covered by the remaining areas of the sixth layer 762. Portions of the upper surfaces of the first, second and third areas 7160, 7162 and 7164 of the fourth layer 716 are thus deoxidized (that is to say, the oxide is removed). The oxide is preferably removed locally through a wet etching method.

One thus retains: a first area 7600 of the fifth layer 760 covered by the first area 7620 of the sixth layer 762; a second area 7602 of the fifth layer 760 covered by the second area 7622 of the sixth layer 762; and a third area 7604 of the fifth layer 760 covered by the third area 7624 of the sixth layer 762.

The second and third areas 7602 and 7604 of the fifth layer 760 are L-shaped. These second and third areas 7602 and 7604 of the fifth layer 760 respectively constitute two second parts 7602 and 7604 of the second spacers 780 and 782 in order to produce the bipolar transistor 300. Thus, in the example of FIG. 11: the spacer 780 is constituted by a first part 7622 (the second area 7622 of the sixth layer 762) and a second part 7602 (the second area 7602 of the fifth layer 760); and the spacer 782 is constituted by a first part 7624 (the third area 7624 of the sixth layer 762) and a second part 7604 (the third area 7604 of the fifth layer 760).

Figure 12:
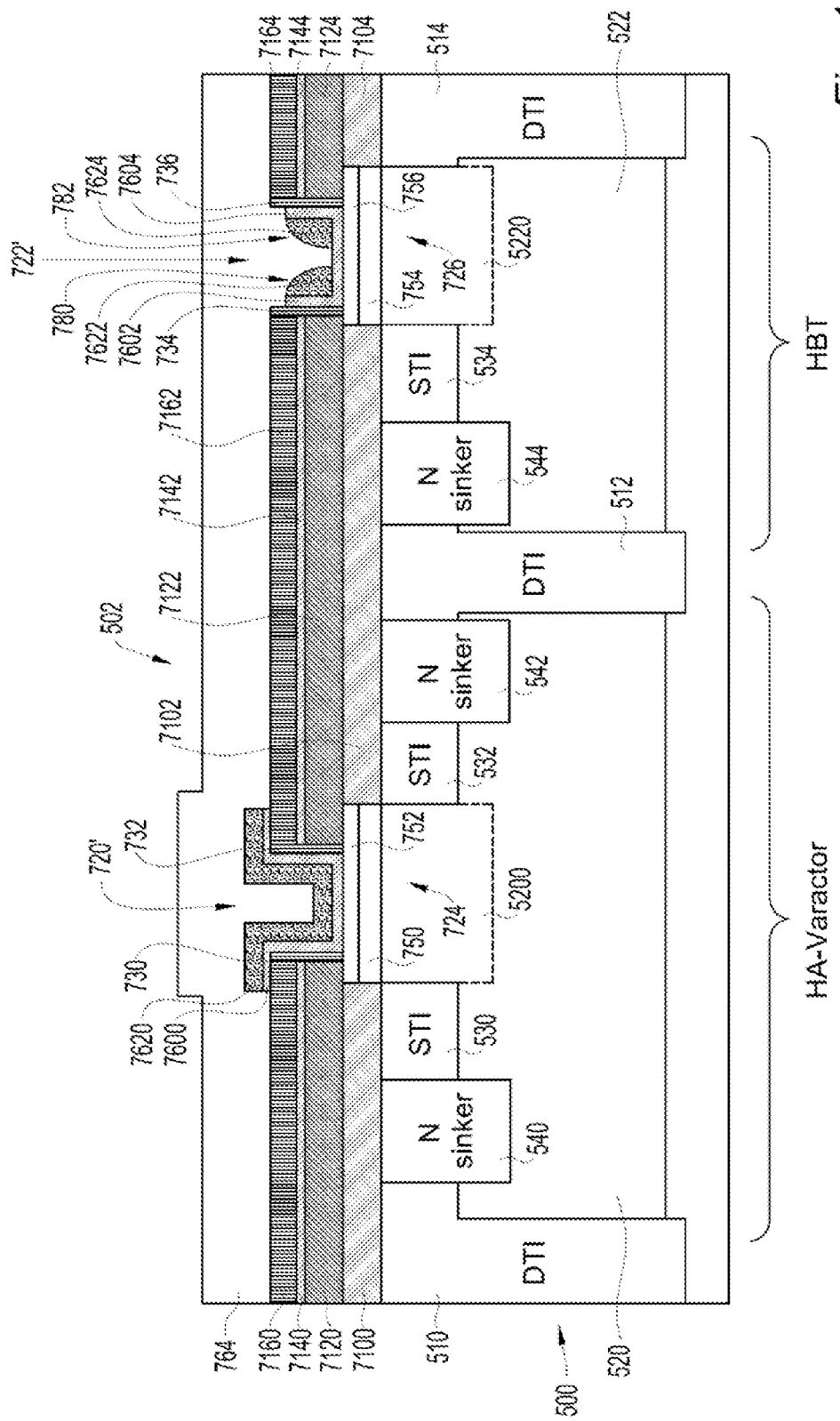

FIG. 12 shows, schematically and in cross-section, still another step of the embodiment of the method for producing a varicap diode and bipolar transistor, made from the structure as disclosed in relation with FIG. 11.

During this step, deposited on the structure, on the side of the upper surface 502 of the substrate 500 (at the top, in FIG. 12), is an eighth layer 764 made from a doped material with the first conductivity type, here type n. The eighth layer 764 is preferably constituted from the same material as that of the first and third deposits 750 and 754.

More specifically, the eighth layer 764 covers: the free upper surfaces of the first, second and third areas 7160, 7162 and 7164 of the fourth layer 716; the upper faces of the first spacers 734 and 736; the free faces of the first area 7600 of the fifth layer 760; the free faces of the first area 7620 of the sixth layer 762; and the free faces of the second spacers 780 and 782, in other words, the free faces of the second and third areas 7602 and 7604 of the fifth layer 760 as well as the free faces of the second and third areas 7622 and 7624 of the sixth layer 762.

The eighth layer 764 preferably has a sufficient thickness to completely fill in (or fill) the fifth and sixth openings 720' and 722'. For example, the eighth layer 764 has a thickness of between 60 nm and 140 nm, preferably about 100 nm, more preferably equal to 100 nm.

Figure 13:
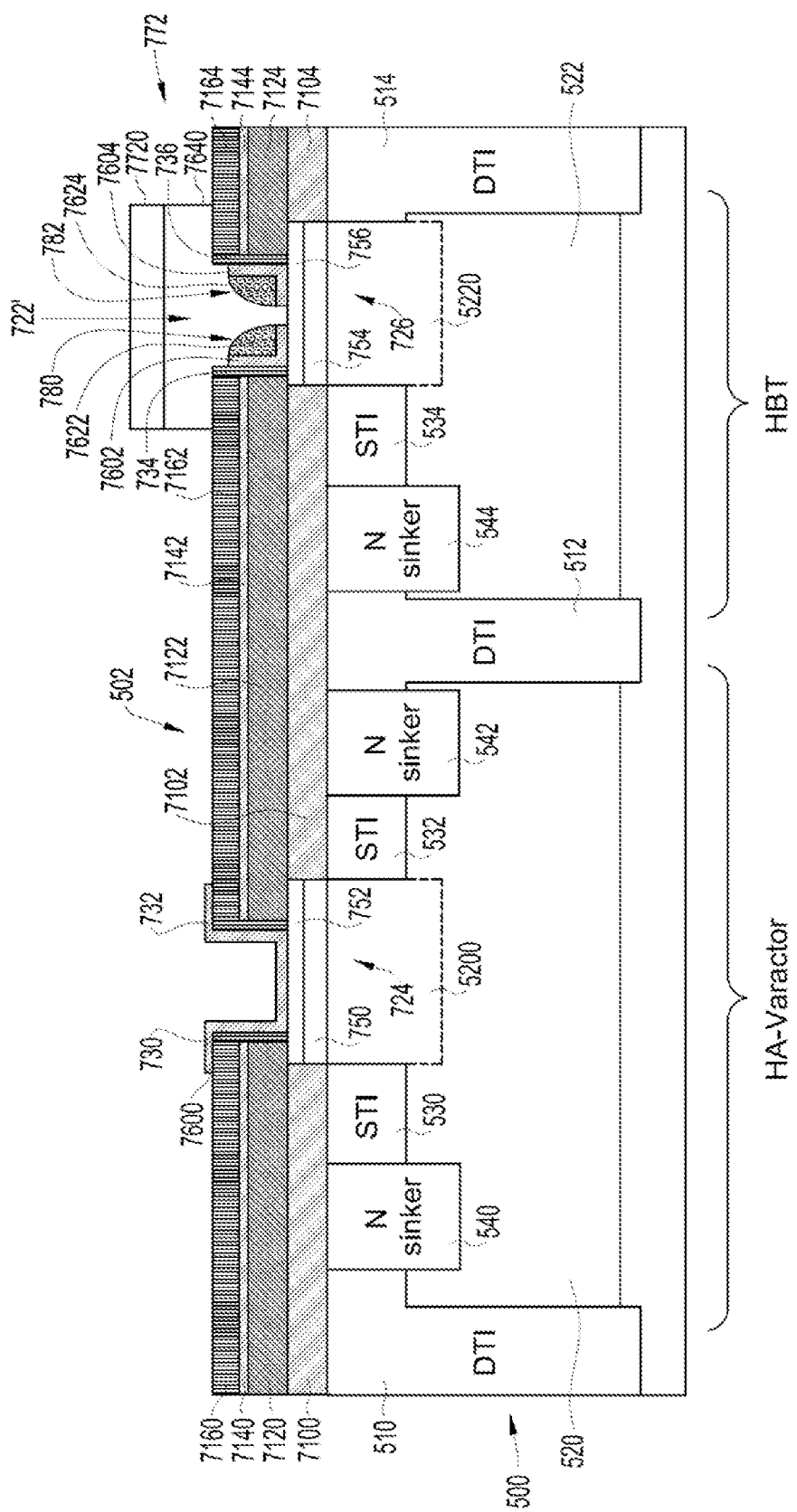

FIG. 13 shows, schematically and in cross-section, still another step of the embodiment of the method for producing a varicap diode and bipolar transistor, made from the structure as disclosed in relation with FIG. 12.

During this step, the future bipolar transistor 300 is protected with a view to later steps. This protection is for example produced by: a first operation consisting of depositing, on the entire upper surface of the eighth layer 764 (not shown in FIG. 13), a ninth layer 772 (only the portion 7720 of which remains at the end of the step and is visible), constituted by a photolithography photoresist; a second operation consisting of exposing, through a mask, this ninth photoresist layer 772; and a third operation consisting of eliminating, by etching, exposed parts of the ninth layer 772 and etching the layer 764 so as to keep only, in the transistor location, an area 7720 (not exposed) of the ninth layer 772 and an area 7640 (protected by the area 7720) of the eighth layer 764.

The etching of the eighth layer 764 in order to obtain the area 7640 is, for example, done by a dry etching method (plasma etching, for example). The area 7640 is, for example, centered relative to the sixth opening 722'. This area 7640 has, in this example, a width greater than that of the area 5220 of the second extrinsic collector region 522.

According to this embodiment, the etching operation of the layers 772 and 764 is prolonged until the first area 7620 (FIG. 12) of the sixth layer 762 is completely eliminated. The second and third areas 7622 and 7624 of the sixth layer 762 in turn being protected by the area 7720 of the ninth layer 772 and by the area 7640 of the eighth layer 764, these areas 7622 and 7624 remain intact at the end of the etching.

The area 7640 of the eighth layer 764 is connected to the fourth deposit 756, that is to say, to the intrinsic base of the bipolar transistor 300. The area 7640 is doped with a type of conductivity other than the intrinsic base 756 (here, the area 7640 is of type n while the base 756 is of type p). The area 7640 of the eighth layer 764 then constitutes an emitter of the bipolar transistor 300.

Figure 14:
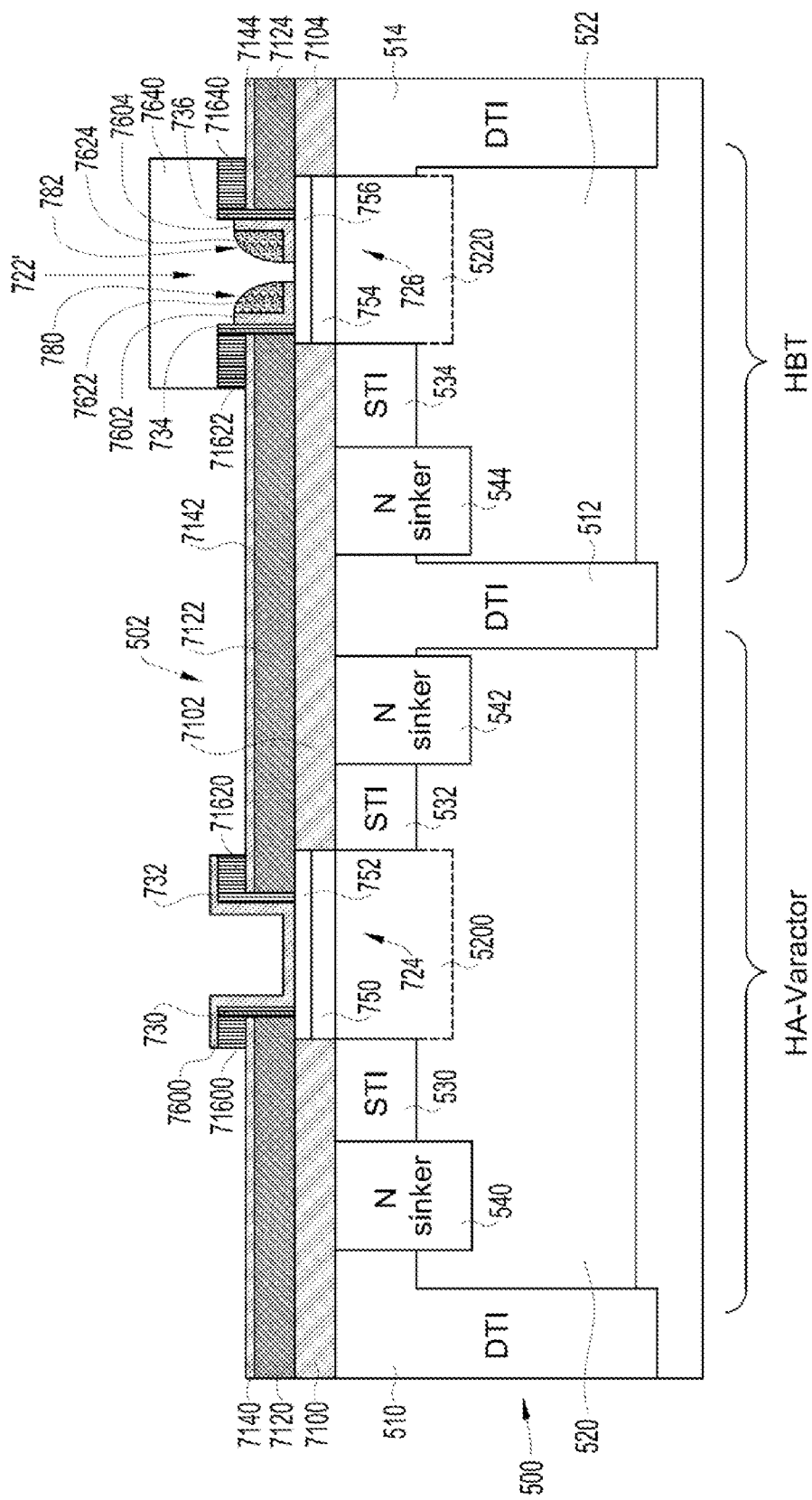

FIG. 14 shows, schematically and in cross-section, still another step of the embodiment of the method for producing a varicap diode and bipolar transistor, made from the structure as disclosed in relation with FIG. 13.

During this step, the area 7720 of the ninth layer 772 is eliminated, then the first, second and third areas 7160, 7162 and 7164 of the fourth layer 716 that are not covered are etched. This etching operation therefore eliminates portions of the areas 7160, 7162 and 7164 that are not protected by the first area 7600 of the fifth layer 760 or by the area 7640 of the eighth layer 764.

In this example, one thus retains only: a portion 71600 of the first area 7160 of the fourth layer 716 located level with the first area 7600 of the fifth layer 760; a first portion 71620 of the second area 7162 of the fourth layer 716 located level with the first area 7600 of the fifth layer 760; a second portion 71622 of the second area 7162 of the fourth layer 716 located level with the area 7640 of the eighth layer 764; and a portion 71640 of the third area 7164 of the fourth layer 716 located level with the area 7640 of the eighth layer 764.

Figure 15:
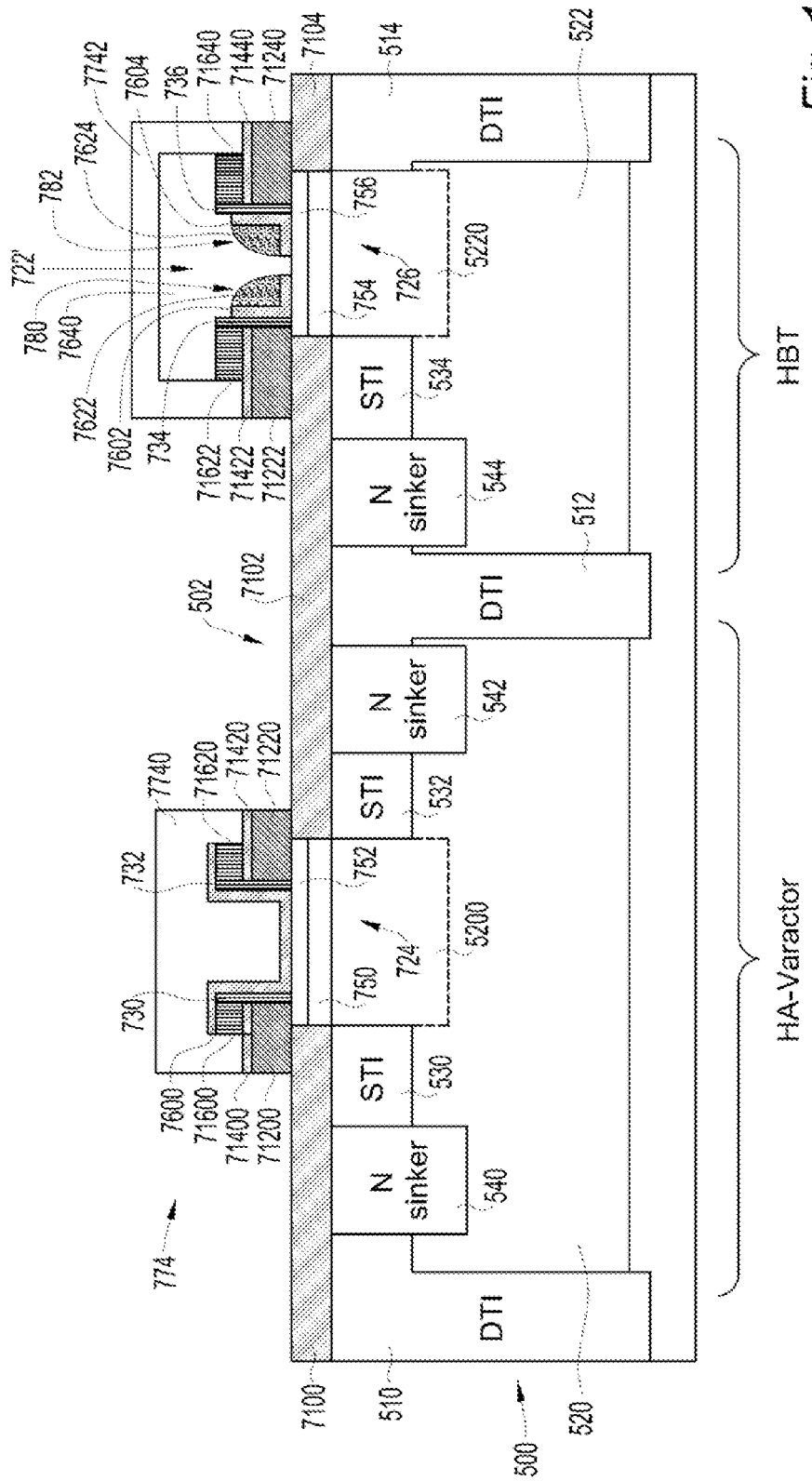

FIG. 15 shows, schematically and in cross-section, still another step of the embodiment of the method for producing a varicap diode and bipolar transistor, made from the structure as disclosed in relation with FIG. 14.

During this step, the future variable capacitance diode 100 and the future bipolar transistor 300 are protected with a view to later steps. These protections are for example done by: a first operation consisting of depositing, on the structure, on the side of the upper surface 502 of the substrate 500 (on top, in FIG. 15), a tenth layer 774 (only the portions 7740 and 7742 of which remain at the end of the step and are visible), constituted from a photolithography photoresist; a second operation consisting of exposing, through a mask, this tenth photoresist layer 774; and a third operation consisting of eliminating, by etching, exposed parts of the tenth layer 774 so as to keep only first and second areas 7740 and 7742 (not exposed) of this layer 774, in the diode location and the transistor location, respectively.

In FIG. 15, only these first and second areas 7740 and 7742 of the tenth layer 774 have been shown.

The first area 7740 of the tenth layer 774 covers, in this example: the first area 7600 of the fifth layer 760; the free lateral face of the portion 71600 of the first area 7160 of the fourth layer 716; the free lateral face of the first portion 71620 of the second area 7162 of the fourth layer 716; the free upper face of a portion 71400 of the first area 7140 of the third layer 714; and the free upper face of a first portion 71420 of the second area 7142 of the third layer 714.

The second area 7742 of the tenth layer 774 covers, still in this example: the area 7640 of the eighth layer 764; the free lateral face of the second portion 71622 of the second area 7162 of the fourth layer 716; the free lateral face of the portion 71640 of the third area 7164 of the fourth layer 716; the free upper face of a second portion 71422 of the second area 7142 of the third layer 714; and the free upper face of a portion 71440 of the third area 7144 of the third layer 714.

One next etches the areas of the second and third layers 712 and 714, which are not located level with the first and second areas 7740 and 7742 of the tenth layer 774. In other words, one eliminates portions of the areas of the second and third layers 712 and 714 that are not covered by areas 7740 and 7742.

One thus retains, in the diode location: the portion 71400 of the first area 7140 of the third layer 714; a portion 71200 of the first area 7120 of the second layer 712; the first portion 71420 of the second area 7142 of the third layer 714; and a first portion 71220 of the second area 7122 of the second layer 712.

Likewise, one thus retains, in the transistor location: the second portion 71422 of the second area 7142 of the third layer 714; a second portion 71222 of the second area 7122 of the second layer 712; the portion 71440 of the third area 7144 of the third layer 714; and a portion 71240 of the third area 7124 of the second layer 712.

The portions 71222 and 71240 are connected to the fourth deposit 756, that is to say, to the intrinsic base of the bipolar transistor 300. These portions 71222 and 71240, doped with the same type as the fourth deposit 756 (here, type p) thus constitute an extrinsic base of the bipolar transistor 300.

Figure 16:
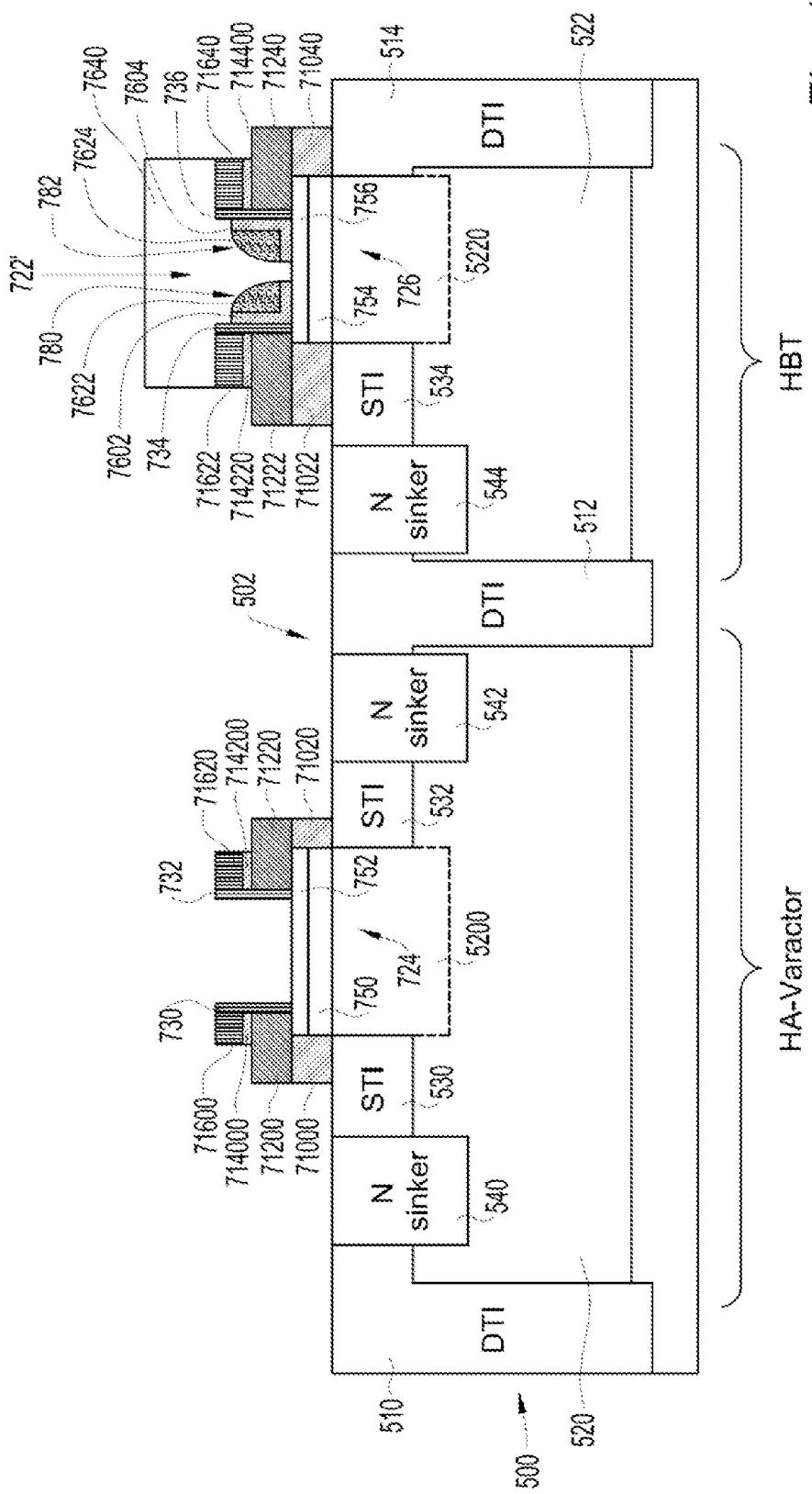

FIG. 16 shows, schematically and in cross-section, still another step of the embodiment of the method for producing a varicap diode and bipolar transistor, made from the structure as disclosed in relation with FIG. 15.

During this step, the first and second areas 7740 and 7742 of the tenth layer 774 are removed (these areas 7740 and 7742 have not been shown in FIG. 16). The uncovered oxide is next eliminated, that is to say, portions of the first, second and third areas 7100, 7102 and 7104 of the first layer 710 that are not covered.

In the example of FIG. 16, one thus retains, in the diode location: a portion 71000 of the first area 7100 of the first layer 710, located level with the portion 71200 of the first area 7120 of the second layer 712; a first portion 71020 of the second area 7102 of the first layer 710, located level with the first portion 71220 of the second area 7122 of the second layer 712; an element 714000 of the portion 71400 of the first area 7140 of the third layer 714, located level with the portion 71600 of the first area 7160 of the fourth layer 716; and an element 714200 of the first portion 71420 of the second area 7142 of the third layer 714, located level with the first portion 71620 of the second area 7162 of the fourth layer 716.

Likewise, still according to this example, retained in the transistor location are: a second portion 71022 of the second area 7102 of the first layer 710, located level with the second portion 71222 of the second area 7122 of the second layer 712; a portion 71040 of the third area 7104 of the first layer 710, located level with the portion 71240 of the third area 7124 of the second layer 712; an element 714220 of the second portion 71422 of the second area 7142 of the third layer 714, located level with the second portion 71622 of the second area 7162 of the fourth layer 716; and an element 714400 of the portion 71440 of the third area 7144 of the third layer 714, located level with the portion 71640 of the third area 7164 of the fourth layer 716.

Figure 17:
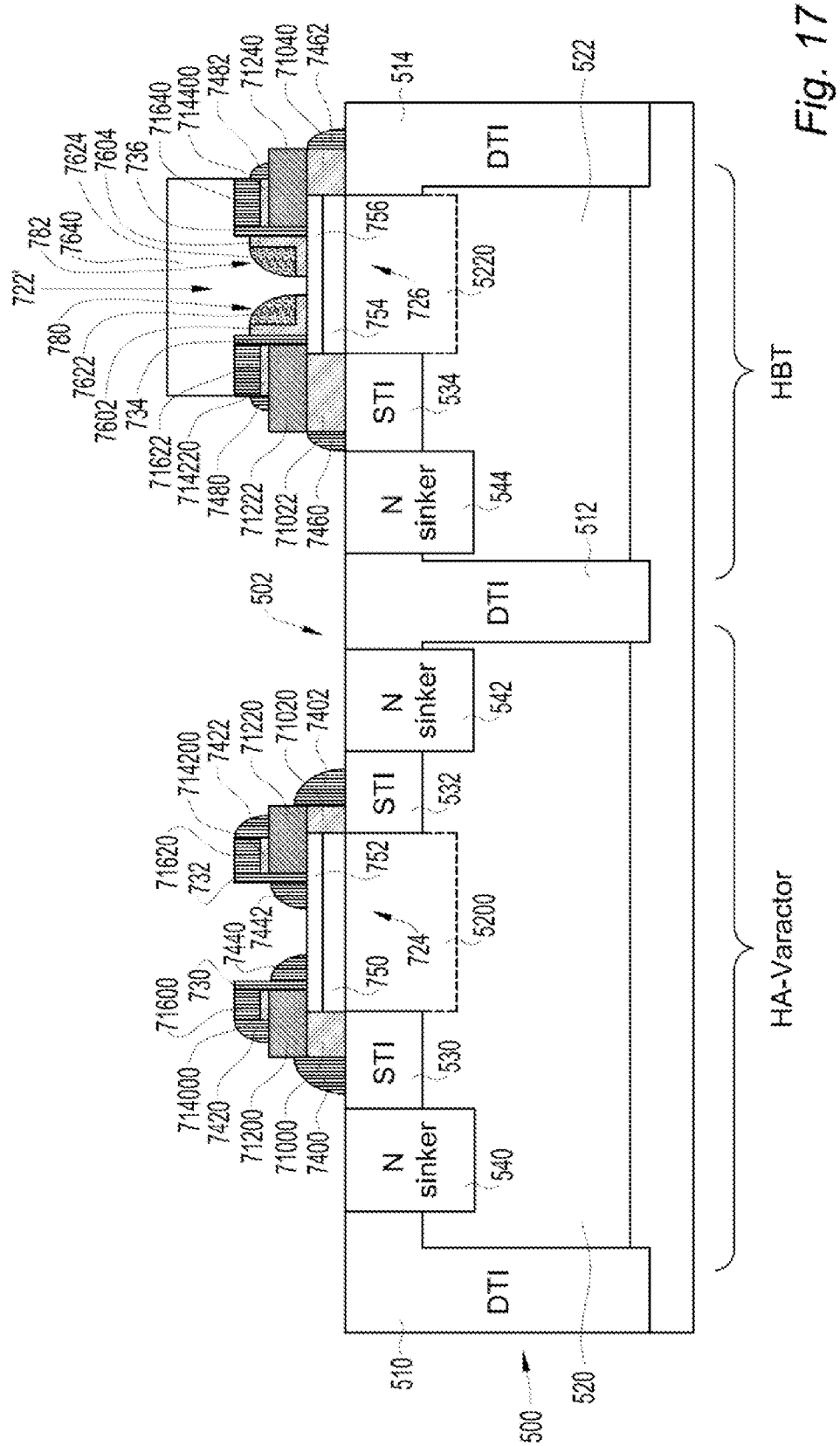

FIG. 17 shows, schematically and in cross-section, still another step of the embodiment of the method for producing a varicap diode and bipolar transistor, made from the structure as disclosed in relation with FIG. 16.

During this step, a deposit is performed in locations, located above the upper surface 502 of the substrate 500, that form right angles. This deposit is constituted by nitride, for example the same nitride as that from which the fourth layer 716 is constituted. Third spacers are thus formed, called "MOS spacers".

In the example of FIG. 17, one more specifically forms, in the diode location: a spacer 7400 partially filling in the right angle formed by the upper surface 502 of the substrate 500 and the free lateral surfaces of the portions 71000 and 71200 of the first areas 7100 and 7120 of the first and second layers 710 and 712, respectively; a spacer 7402 partially filling in the right angle formed by the upper surface 502 of the substrate 500 and the free lateral surfaces of the first portions 71020 and 71220 of the second areas 7102 and 7122 of the first and second layers 710 and 712, respectively; a spacer 7420 partially filling in the right angle formed by the upper surface of the portion 71200 of the first area 7120 of the second layer 712 and the free lateral surfaces of the element 714000 of the portion 71400 of the first area 7140 of the third layer 714 and the portion 71600 of the first area 7160 of the fourth layer 716; a spacer 7422 partially filling in the right angle formed by the upper surface of the first portion 71220 of the second area 7122 of the second layer 712 and the free lateral surfaces of the element 714200 of the first portion 71420 of the second area 7142 of the third layer 714 and the first portion 71620 of the second area 7162 of the fourth layer 716; a spacer 7440 partially filling in the right angle formed by the upper surface of the second deposit 752 and by the free lateral surface of the spacer 730; and a spacer 7442 partially filling in the right angle formed by the upper surface of the second deposit 752 and by the free lateral surface of the spacer 732.

Still in the example of FIG. 17, one more specifically forms, in the transistor location: a spacer 7460 partially filling in the right angle formed by the upper surface 502 of the substrate 500 and by the free lateral surfaces of the second portions 71022 and 71222 of the second areas 7102 and 7122 of the first and second layers 710 and 712, respectively; a spacer 7462 partially filling in the right angle formed by the upper surface 502 of the substrate 500 and by the free lateral surfaces of the portions 71040 and 71240 of the third areas 7104 and 7124 of the first and second layers 710 and 712, respectively; a spacer 7480 partially filling in the right angle formed by the upper surface of the second portion 71222 of the second area 7122 of the second layer 712 and the free lateral surfaces of the element 714220 of the second portion 71422 of the second area 7142 of the third layer 714 and the second portion 71622 of the second area 7162 of the fourth layer 716; and a spacer 7482 partially filling in the right angle formed by the upper surface of the portion 71240 of the third area 7124 of the second layer 712 and the free lateral surfaces of the element 714400 of the portion 71440 of the third area 7144 of the third layer 714 and the portion 71640 of the third area 7164 of the fourth layer 716.

The MOS spacers 7400, 7402, 7420, 7422, 7440, 7442, 7460, 7462, 7480 and 7482 approximately a "quarter-circle" shape in FIG. 17. These MOS spacers 7400, 7402, 7420, 7422, 7440, 7442, 7460, 7462, 7480 and 7482 are not shown to scale in FIG. 17.

In the diode location, in the example of FIG. 17: the spacer 7400 partially covers the upper surface of the shallow isolation trench 530, completely covers the free lateral surface of the portion 71000 and partially covers the free lateral surface of the portion 71200; the spacer 7402 partially covers the upper surface of the shallow isolation trench 532, completely covers the free lateral surface of the portion 71020 and partially covers the free lateral surface of the portion 71220; the spacer 7420 partially covers the upper surface of the portion 71200, completely covers the free lateral surface of the element 714000 and partially covers the free lateral surface of the portion 71600; the spacer 7422 partially covers the upper surface of the portion 71220, completely covers the free lateral surface of the element 714200 and partially covers the free lateral surface of the portion 71620; the spacer 7440 partially covers the upper surface of the second deposit 752 and partially covers the free lateral surface of the spacer 730; and the spacer 7442 partially covers the upper surface of the second deposit 752 and partially covers the free lateral surface of the spacer 732.

In the transistor location, still in the example of FIG. 17: the spacer 7460 partially covers the upper surface of the shallow isolation trench 534 and partially covers the free lateral surface of the portion 71022; the spacer 7462 partially covers the upper surface of the deep isolation trench 514 and partially covers the free lateral surface of the portion 71040; the spacer 7480 partially covers the upper surface of the portion 71222, completely covers the free lateral surface of the element 714220 and partially covers the free lateral surface of the portion 71622; and the spacer 7482 partially covers the upper surface of the portion 71240, completely covers the free lateral surface of the element 714400 and partially covers the free lateral surface of the portion 71640.

Figure 18:
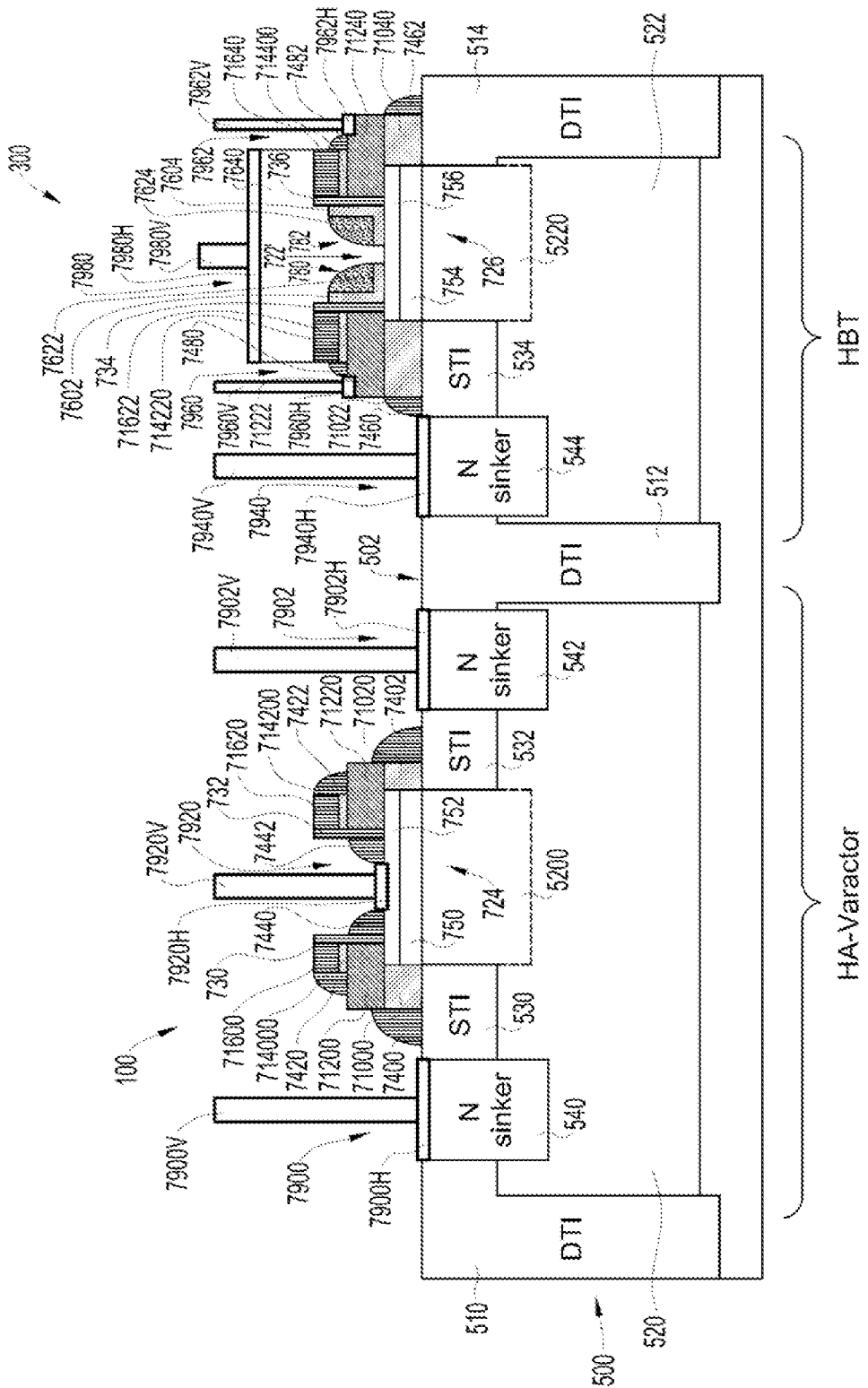

FIG. 18 shows, schematically and in cross-section, still another step of the embodiment of the method for producing a varicap diode and bipolar transistor, made from the structure as disclosed in relation with FIG. 17.

During this step, contact reacting elements of the variable capacitance diode 100 and the bipolar transistor 300 are produced. These contact reacting elements are for example obtained by siliconizing of the free horizontal surfaces of the structure that do not belong to deep or shallow isolation trenches.

More particularly, in the diode location: a contact reacting element 7900 is formed in line with the first sink 540; a contact reacting element 7902 is formed in line with the second sink 542; and a contact reacting element 7920 is formed in line with the area 5200 of the first extrinsic collector region 520.

The contact reacting element 7900 is made up of a horizontal portion 7900H, completely covering the upper surface of the first sink 540, and a vertical portion 7900V. The contact reacting element 7902 is made up of a horizontal portion 7902H, completely covering the upper surface of the second sink 542, and a vertical portion 7902V. The contact reacting element 7920 is made up of a horizontal portion 7920H, covering the free upper surface of the second deposit 752, and a vertical portion 7920V.

Likewise, in the transistor location: a contact reacting element 7940 is formed in line with the third sink 544; a contact reacting element 7960 is formed in line with the free upper surface of the second portion 71222 of the second area 7122 of the second layer 712; a contact reacting element 7962 is formed in line with the free upper surface of the portion 71240 of the third area 7124 of the second layer 712; and a contact reacting element 7980 is formed in line with the area 7640 of the eighth layer 764.

The contact reacting element 7940 is constituted by a horizontal portion 7940H, completely covering the upper surface of the third sink 544, and a vertical portion 7940V. The contact reacting element 7960 is constituted by a horizontal portion 7960H, completely covering the free upper surface of the portion 71222, and a vertical portion 7960V. The contact reacting element 7962 is constituted by a horizontal portion 7962H, completely covering the free upper surface of the portion 71240, and a vertical portion 7962V. The contact reacting element 7980 is constituted by a horizontal portion 7980H, completely covering the free upper surface of the area 7640, and a vertical portion 7980V.

The respective vertical portions 7900V, 7902V, 7920V, 7940V, 7960V, 7962V and 7980V of the contact reacting elements 7900, 7902, 7920, 7940, 7960, 7962 and 7980 are substantially perpendicular to the horizontal portions 7900H, 7902H, 7920H, 7940H, 7960H, 7962H and 7980H and approximately centered relative to these same horizontal portions. In other words, the contact reacting elements 7900, 7902, 7920, 7940, 7960, 7962 and 7980 are in the form of an inverted T.

In the diode location, the contact reacting elements 7900 and 7902 are both connected, respectively by the first and second sinks 540 and 542, to the first extrinsic collector region 520. This first extrinsic collector region 520 is in turn connected, by its area 5200, to the first deposit 750. In the example where the first deposit 750 is n-doped, the contact reacting elements 7900 and 7902 therefore constitute cathode contacts (or terminals) of the varicap diode 100.

The contact reacting element 7920 is directly connected to the second deposit 752. In the example where the second deposit 752 is p-doped, the contact reacting element 7920 therefore constitutes an anode contact (or terminal) of the varicap diode 100.

In the transistor location, the contact reacting element 7940 is connected, by the third sink 544, to the second extrinsic collector region 522. This second extrinsic collector region 522 is in turn connected, by its area 5220, to the third deposit 754, which constitutes the intrinsic collector of the bipolar transistor 300. The contact reacting element 7940 therefore constitutes a collector contact (or a terminal) of the bipolar transistor 300.

The contact reacting elements 7960 and 7962 are respectively connected to the second portion 71222 of the second area 7122 of the second layer 712 and to the portion 71240 of the third area 7124 of the second layer 712. These portions 71222 and 71240, which constitute the extrinsic base of the bipolar transistor 300, are in turn connected to the fourth deposit 756, which constitutes the intrinsic base of the bipolar transistor 300. The contact reacting elements 7960 and 7962 therefore constitute base contacts (or terminals) of the bipolar transistor 300.

The contact reacting element 7980 is directly connected to the area 7640 of the eighth layer 764, which constitutes the emitter of the bipolar transistor 300. The contact reacting element 7980 therefore constitutes an emitter contact (or a terminal) of the bipolar transistor 300.

The embodiment of the method whose successive steps have been described in relation with FIGS. 1 to 18 has the advantage of making it possible to produce, at the same time (jointly), the variable capacitance diode 100 and the bipolar transistor 300. This therefore reduces the number of manufacturing steps of the diode 100 and the transistor 300 relative to a method according to which the diode 100 and the transistor 300 are made separately, one after the other.

Another advantage of the embodiment described above lies in the fact that the deposits 750, 752, 754 and 756 (or the deposits 752' and 756' in the case of the variant disclosed in relation with FIG. 7) are preferably obtained by epitaxy (by epitaxial growth). This thus allows the first and second deposits 750 and 752 (or the area 5200 of the first extrinsic collector region 520 and the deposit 752' in the case of the variant) to form a p-n junction having a very pronounced interface, that is to say, in the vicinity of which the dopant profile varies quite significantly. One thus obtains a varactor 100 with so-called "hyperabrupt" p-n junction, referred to as "hyperabrupt varactor". In other words, the varicap diode 100 is a variable capacitance diode provided with an abrupt dopant profile near the interface of its p-n junction.

One or several variable capacitance diodes 100 and one or several bipolar transistors 300 as described can thus be manufactured in order to produce an electronic circuit.

Figure 19:
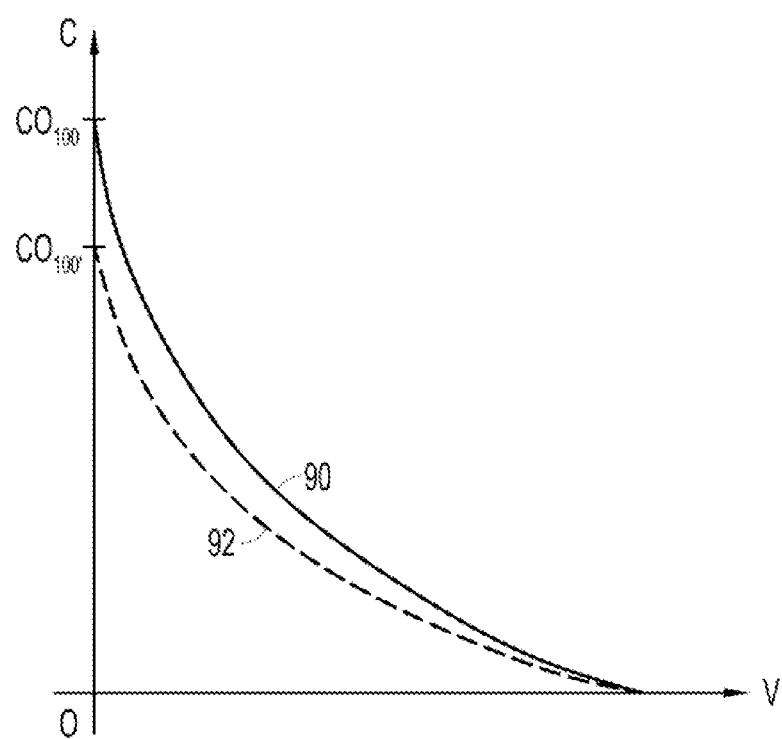
FIG. 19 shows variation curves of a characteristic property of the varicap diodes obtained using the embodiment of the method as described.

FIG. 19 shows variation curves of a characteristic property of the varicap diodes obtained using the embodiment of the method as described.

FIG. 19 reflects variations of the electrical capacitance, denoted C, of varicap diodes as a function of a voltage, denoted V, with reversed polarization applied between their anode (terminal 7920 in FIG. 18) and their cathode (terminals 7900 and 7902 in FIG. 18).

In the example of FIG. 19: a first curve 90 in solid lines illustrates, as a function of the polarization voltage V, the capacity variation C of the diode 100 whose p-n junction is formed, as disclosed in relation with FIG. 6, by the first and second deposits 750 and 752, these deposits 750 and 752 preferably both being epitaxied; and a second curve 92 in dotted lines illustrates, as a function of the polarization voltage V, the capacity variation C of another diode (not shown) including a p-n junction formed, like in the case of the variant disclosed in relation with FIG. 7, by the fifth deposit 752' and by the area 5200 of the first extrinsic collector region 520, this fifth deposit 752' preferably being epitaxied.

For a nil polarization voltage, the inventors have observed that the diode 100 had an electrical capacity, denoted $C0_{100}$, greater than the electrical capacity, denoted herein $C0_{100}'$, of the diode comprising a p-n junction formed, as in the case of the variant disclosed with reference to FIG. 7, by the fifth deposit 752' and by the area 5200 of the first extrinsic collector region 520. This phenomenon appears to be explained by the presence, in the diode 100, of the first deposit 750 inserted between the second deposit 752 and the area 5200 of the first extrinsic collector region 520. In general, the presence of the first deposit 750 in the case of the diode 100 makes it possible to obtain a higher electrical capacity than that of the diode without the deposit 750.

Various embodiments and modes of implementation have been described. Those skilled in the art will understand that certain features of these embodiments can be combined and other variants will readily occur to those skilled in the art. In particular, that which was previously described in relation with FIGS. 1 to 18 uses, as example, an embodiment of a joint mode of implementation (or co-integration) of a bipolar transistor of the NPN type and/or variable capacitance diode. However, the types of conductivity (the dopings) used as examples in the present description can be modified (or reversed). In particular, the adaptation of this mode of implementation to a joint embodiment of a bipolar transistor of the PNP type and a variable capacitance diode is within the capabilities of those skilled in the art based on the functional description provided hereinabove.

Finally, the practical implementation of the embodiments and variants described herein is within the capabilities of those skilled in the art based on the functional description provided hereinabove. In particular, the manufacture of the substrate 500 used for the implementation of the method disclosed in relation with FIGS. 1 to 18 is within the capabilities of those skilled in the art. The deposition, masking and etching operations are also within the capabilities of those skilled in the art from the above description.

The invention claimed is:

1. A method, comprising jointly producing a bipolar transistor and a variable capacitance diode on a common substrate, wherein jointly producing comprises:
    forming an insulating layer over the common substrate;
    forming a conductive layer over the insulating layer;
    forming a first opening extending through the conductive and insulating layers;
    forming a second opening extending through the conductive and insulating layers;
    simultaneously forming an intrinsic base of the bipolar transistor and a diode node of the variable capacitance diode;
    wherein simultaneously forming comprises forming the diode node of the variable capacitance diode in the first opening at the insulating layer and forming the intrinsic base of the bipolar transistor in the second opening at the insulating layer;
    depositing a sacrificial layer over the diode node of the variable capacitance diode and over the intrinsic base of the bipolar transistor;
    forming spacers from the deposited sacrificial layer within the second opening over the intrinsic base of the bipolar transistor; and
    then forming an emitter of the bipolar transistor over the intrinsic base while the diode node of the variable capacitance diode is covered by the sacrificial layers;
    wherein the emitter of the bipolar transistor is positioned between the spacers and in contact with the intrinsic base.

2. The method according to claim 1, wherein said variable capacitance diode includes a p-n junction, the method comprising:
    forming the p-n junction from a first region with a first type of conductivity and a second region with a second type of conductivity;
    wherein simultaneously forming comprises forming said second region and the intrinsic base of said bipolar transistor during a same step.

3. The method according to claim 2, wherein said second region is formed in contact with an extrinsic collector region constituting said first region and formed within the common substrate.

4. The method according to claim 2, further comprising epitaxially forming said second region.

5. The method according to claim 2, wherein jointly producing further comprises:
    forming a third region, with the first conductivity type, in contact with said first region, wherein said first region is an extrinsic collector region and wherein said first region is formed within the common substrate; and
    wherein said second region is formed in contact with said third region.

6. The method according to claim 5, wherein said third region and an intrinsic collector of said bipolar transistor are made during a same step.

7. The method according to claim 5, further comprising epitaxially forming said third region.

8. The method according to claim 2, wherein the first type of conductivity is n-type and the second type of conductivity is p-type.

9. The method according to claim 2, wherein the first type of conductivity is p-type and the second type of conductivity is n-type.

10. The method according to claim 1, wherein said variable capacitance diode includes a varactor with a hyperabrupt p-n junction.

11. The method according to claim 1, wherein the common substrate includes a first extrinsic collector region insulated from a second extrinsic collector region, and wherein simultaneously forming comprises forming the diode node of the variable capacitance diode over the first extrinsic collector region and forming the intrinsic base of the bipolar transistor over the second extrinsic collector region.

12. The method according to claim 1, further comprising patterning the conductive layer to form an extrinsic base of the bipolar transistor in contact with the intrinsic base.

\* \* \* \* \*